(12) United States Patent
Ishikawa

(10) Patent No.: US 10,485,151 B2
(45) Date of Patent: Nov. 19, 2019

(54) LOOSE COMPONENT SUPPLY DEVICE AND COMPONENT MOUNTER

(71) Applicant: FUJI CORPORATION, Chiryu-shi (JP)

(72) Inventor: Kazuma Ishikawa, Chiryu (JP)

(73) Assignee: FUJI CORPORATION, Chiryu-shi (JP)

(*) Notice: Subject to any disclaimer, the term of this patent is extended or adjusted under 35 U.S.C. 154(b) by 235 days.

(21) Appl. No.: 15/314,013

(22) PCT Filed: Jun. 3, 2014

(86) PCT No.: PCT/JP2014/064713
§ 371 (c)(1),
(2) Date: Nov. 25, 2016

(87) PCT Pub. No.: WO2015/186188
PCT Pub. Date: Dec. 10, 2015

(65) Prior Publication Data
US 2017/0196131 A1     Jul. 6, 2017

(51) Int. Cl.
*H05K 13/02* (2006.01)
*H05K 13/08* (2006.01)

(52) U.S. Cl.
CPC ......... *H05K 13/028* (2013.01); *H05K 13/022* (2013.01); *H05K 13/08* (2013.01); *H05K 13/0813* (2018.08)

(58) Field of Classification Search
CPC ............ H05K 13/081; H05K 13/0812; H05K 13/028; H05K 13/08; H05K 13/0813; H05K 13/022
See application file for complete search history.

(56) References Cited

U.S. PATENT DOCUMENTS 4,187,051 A * 2/1980 Kirsch ............... B25J 9/041
414/744.3
5,060,366 A * 10/1991 Asai ................ H05K 13/0413
29/739

(Continued)

FOREIGN PATENT DOCUMENTS

JP    6-127698 A    5/1994
JP    10-202569 A    8/1998

(Continued)

OTHER PUBLICATIONS

Extended European Search Report dated May 2, 2017 in Patent Application No. 14894058.8.

(Continued)

*Primary Examiner* — Peter Dungba Vo
*Assistant Examiner* — Jeffrey T Carley
(74) *Attorney, Agent, or Firm* — Oblon, McClelland, Maier & Neustadt, L.L.P.

(57) ABSTRACT

A loose component supply device includes a loose component support section that supports multiple components in a loose state, an imaging device that images the components supported on the loose component support section, a component holding head provided with at least one component holding tool capable of picking up and holding each of the components supported on the loose component support section, a holding head moving device that moves the component holding head at least to and from the loose component support section and a component transfer section at which transfer to a next process is possible, and a holding tool changing device that changes at least one of the one component holding tools based on image data obtained by the imaging of the imaging device.

8 Claims, 19 Drawing Sheets

(56) References Cited

U.S. PATENT DOCUMENTS

| | | | | |
|---|---|---|---|---|
| 6,056,108 | A * | 5/2000 | Buchi | B25J 9/1697 198/395 |
| 6,144,452 | A * | 11/2000 | Hachiya | G01B 11/14 356/615 |
| 6,283,272 | B1 * | 9/2001 | Hsieh | B65G 47/1407 198/394 |
| 2002/0042989 | A1 * | 4/2002 | Kawase | H05K 13/04 29/832 |
| 2002/0083579 | A1 * | 7/2002 | Suhara | H05K 13/0015 29/739 |
| 2002/0092157 | A1 * | 7/2002 | Yoshida | H05K 13/0452 29/740 |
| 2003/0136087 | A1 * | 7/2003 | Lehner | B65B 9/045 53/452 |
| 2010/0042248 | A1 * | 2/2010 | Mylet | B65G 67/04 700/214 |
| 2015/0237772 | A1 * | 8/2015 | Nozawa | H05K 13/028 29/703 |

FOREIGN PATENT DOCUMENTS

| | | |
|---|---|---|
| JP | 2005-305613 A | 11/2005 |
| JP | 2013-094938 A | 5/2013 |

OTHER PUBLICATIONS

International Search Report dated Sep. 2, 2014 in PCT/JP2014/064713 filed Jun. 3, 2014.
Office Action dated Apr. 24, 2018 in Japanese Patent Application No. 2016-524968, with English translation, 9 pages.

* cited by examiner

LOOSE COMPONENT SUPPLY DEVICE AND COMPONENT MOUNTER

TECHNICAL FIELD

The present application relates to a component supply device that supplies multiple components in a loose state and a to component mounter that picks up loose components and mounts them on a circuit board.

BACKGROUND ART

With the loose component supply device disclosed in patent literature 1, image data is acquired by imaging multiple components supported in a loose state on a component support surface using an imaging device. Then, based on the image data, from the multiple components, a target component that is able to be picked up is extracted, and the position of the pickup target components is acquired. A robot is moved to the position and the pickup target component is picked up.

CITATION LIST

Patent Literature

Patent Literature 1
JP-A-H10-202569

SUMMARY

An object of the present disclosure is to pick up in a suitable manner each component of multiple components in a loose state.

The present disclosure changes a component holding tool that picks up a component and changes the height of the component holding tool when picking up the component based on image data obtained by imaging multiple components of the same type that are in a loose state.

Loose state refers to a state in which the orientation of each component is random; multiple components of the same type refers to components for which the shape, size, mass, construction, and the like is the same for each. Each of the multiple components may be components that include multiple surfaces that have a different size or shape, but even if all of these multiple surfaces have a size or shape different to each other, it is acceptable if the size and shape of a portion of the multiple surfaces is the same. For multiple components with a different orientation, there are cases in which the size and shape of the upwards facing surface is different, and there are cases in which the height to the upward facing surface is different. For this, by acquiring the orientation of each of the multiple components based on the image data and changing the component holding tool based on the size and shape of the upwards facing surface, it is possible to pick up a larger quantity of components. Changing the component holding tool refers to exchanging the component holding tool, changing the position of the component holding tool that picks up the component, and the like. Also, by changing the height of the component holding tool when picking up a component based on the height to the upward facing surface, it is possible to effectively prevent damage to pickup target components and damage to component holding tools.

BRIEF DESCRIPTION OF DRAWINGS

FIG. 16A is a perspective view of the component with the front surface facing upwards. FIG. 16B is a perspective view of the component with the rear surface facing upwards.

DETAILED DESCRIPTION

Hereinafter embodiments of the present disclosure are described with reference to the drawings.

First Embodiment

Figure 1:
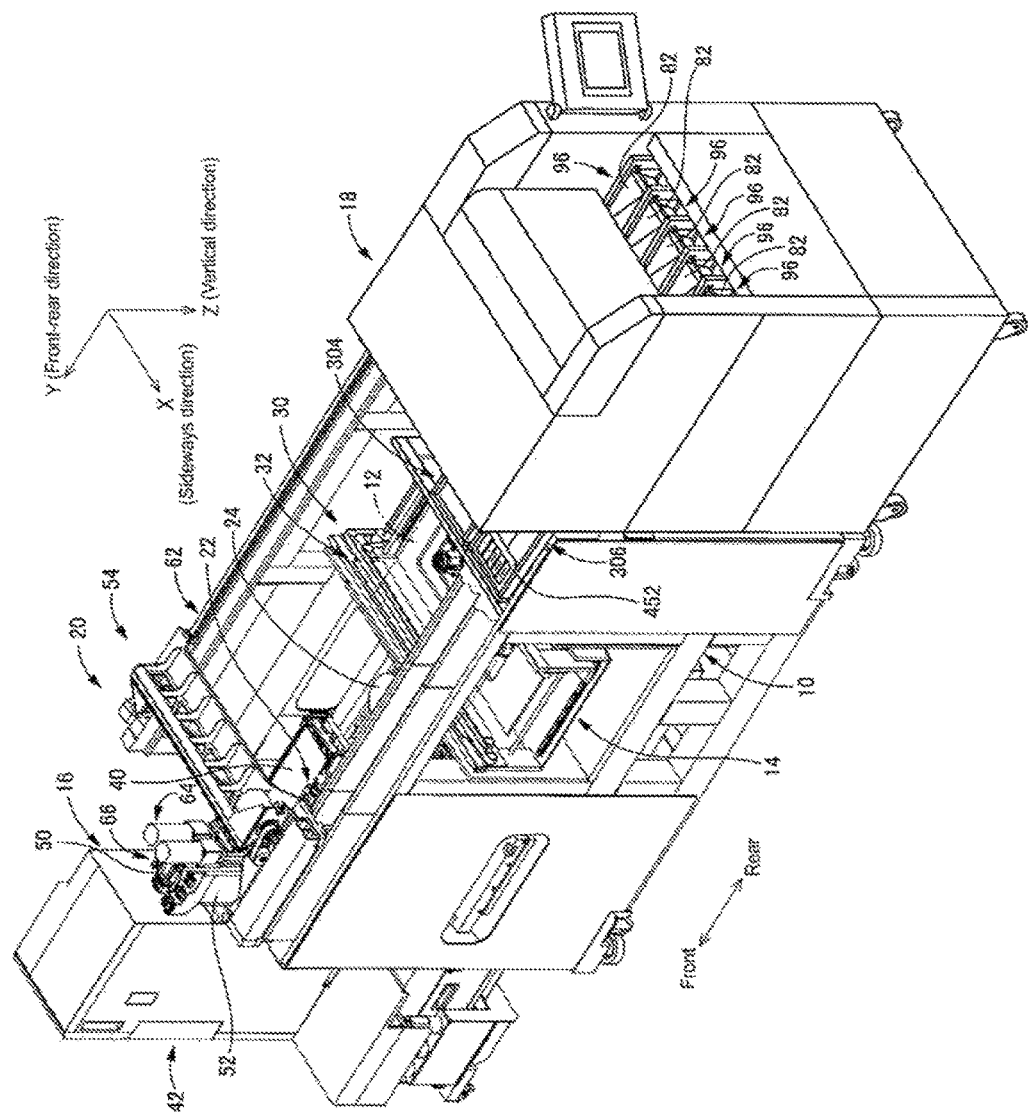
FIG. 1 is a perspective view showing a component mounter of a first embodiment of the present disclosure. The component mounter includes a loose component supply device of a first embodiment of the present disclosure.

FIG. 1 shows a component mounter (an example of an electronic circuit assembly device) of a first embodiment of the present disclosure. The component mounter includes items such as device main body 10, board conveying and holding device 14 that conveys and holds circuit board 12 (hereinafter also referred to as board 12) as a circuit substrate, component supply device 16, loose component supply device 18 of a first embodiment of the present disclosure, component mounting device 20, imaging devices 22 and 24, and control device 26 (refer to FIG. 17). Circuit substrates include printed wiring boards, printed circuit boards, substrates including three-dimensional features, and so on. Circuit board is a general term that includes printed wiring boards and printed circuit boards. Except for the portion relating to the present disclosure, this component mounter has a configuration similar to an electronic circuit assembly device disclosed in JP-A-2011-253869, thus similar portions will be described only briefly.

Board conveying and holding device 14 is positioned centrally inside the component mounter in the front-rear direction, and includes conveyance device 30 that conveys boards 12, clamp device 32 as a holding device that holds board 12, and so on. Board conveying and holding device 14 conveys board 12 in a horizontal orientation horizontally and holds board 12 at a predetermined position. In the present embodiment, the conveyance direction of board 12 (hereinafter also referred to as the board conveyance direction) is the X direction, the width direction of board 12 is the Y direction, and the vertical up-down direction is the Z direction. The X direction, Y direction, and Z direction are perpendicular to each other. Also, the sideways direction and width direction of the component mounter is the X direction and the front-rear direction is the Y direction.

Component supply device 16 includes tray type component supply device 42 that supplies electronic components (hereinafter also referred to as components) via tray 40 and that is provided in front of board conveying and holding device 14, and a feeder type component supply device that supplies components via tape feeders, which are not shown. Loose component supply device 18 is provided to the rear of board conveying and holding device 14; details are described later. Components supplied via these component supply device 16 and loose component supply device 18 include electronic circuit components, configuration components for solder cells, configuration components for power modules, and the like. Among electronic circuit components, there are those with leads and there are those without leads.

Figure 2:
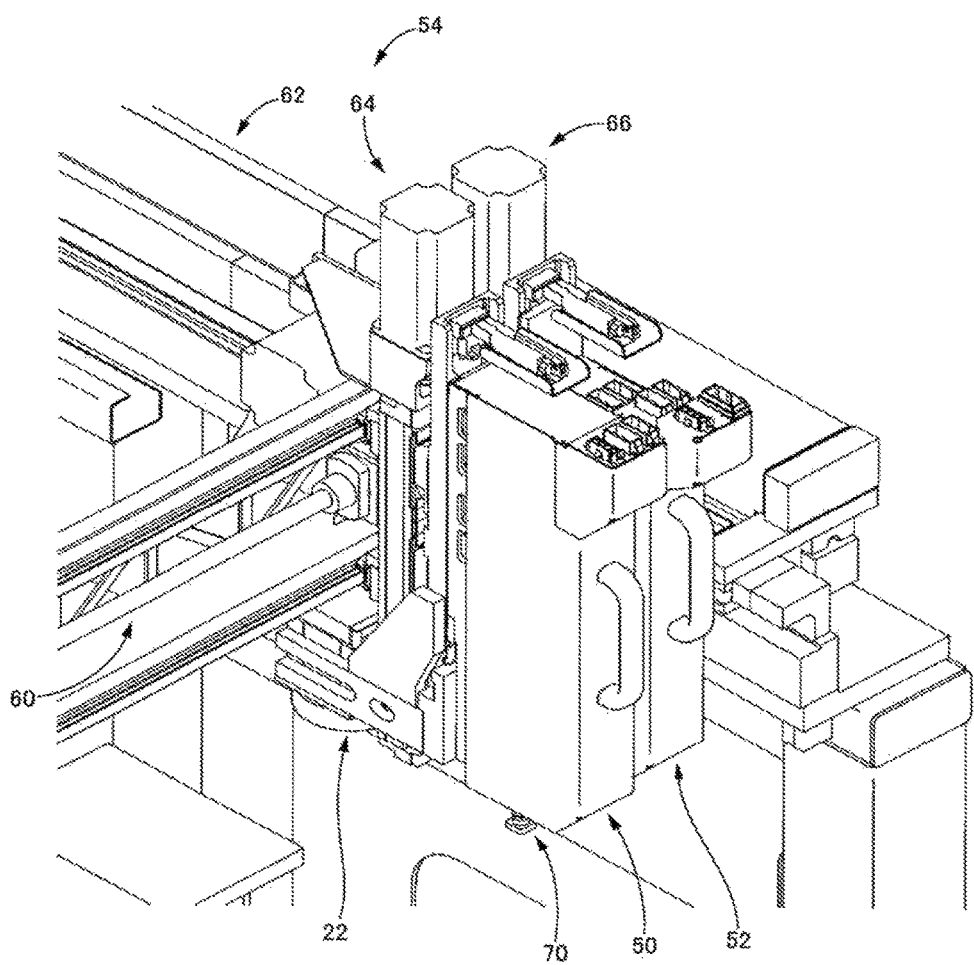
FIG. 2 is a perspective view showing a component mounting device of the above component mounter.

Component mounting device 20 includes work heads 50 and 52, and work head moving device 54. Work head moving device 54 is provided with X-direction moving device 60 (refer to FIG. 2), Y-direction moving device 62, and Z-direction moving devices 64 and 66. Work heads 50 and 52 are moved together to any position on a horizontal plane by X-direction moving device 60 and Y-direction moving device 62, and are each moved independently in the Z direction by Z-direction moving devices 64 and 66 respectively. Work head moving device 54 is configured to be able to move work heads 50 and 52 in a range covering from tray 40 and the like of component supply device 16 to the component transfer position of loose component supply device 18. Work heads 50 and 52 are each provided with a component holding tool 70 (refer to FIG. 2) such as a chuck or a suction nozzle, and are mounting heads that pick up a component and mount the component on board 12.

Imaging device 22 is moved together with work head (hereinafter also referred to as a mounting head) 50 in the X, Y, and Z directions. Imaging device 24 is fixedly provided on a portion of device main body 10 between board conveying and holding device 14 and the component supply section of component supply device 16.

Figure 3:
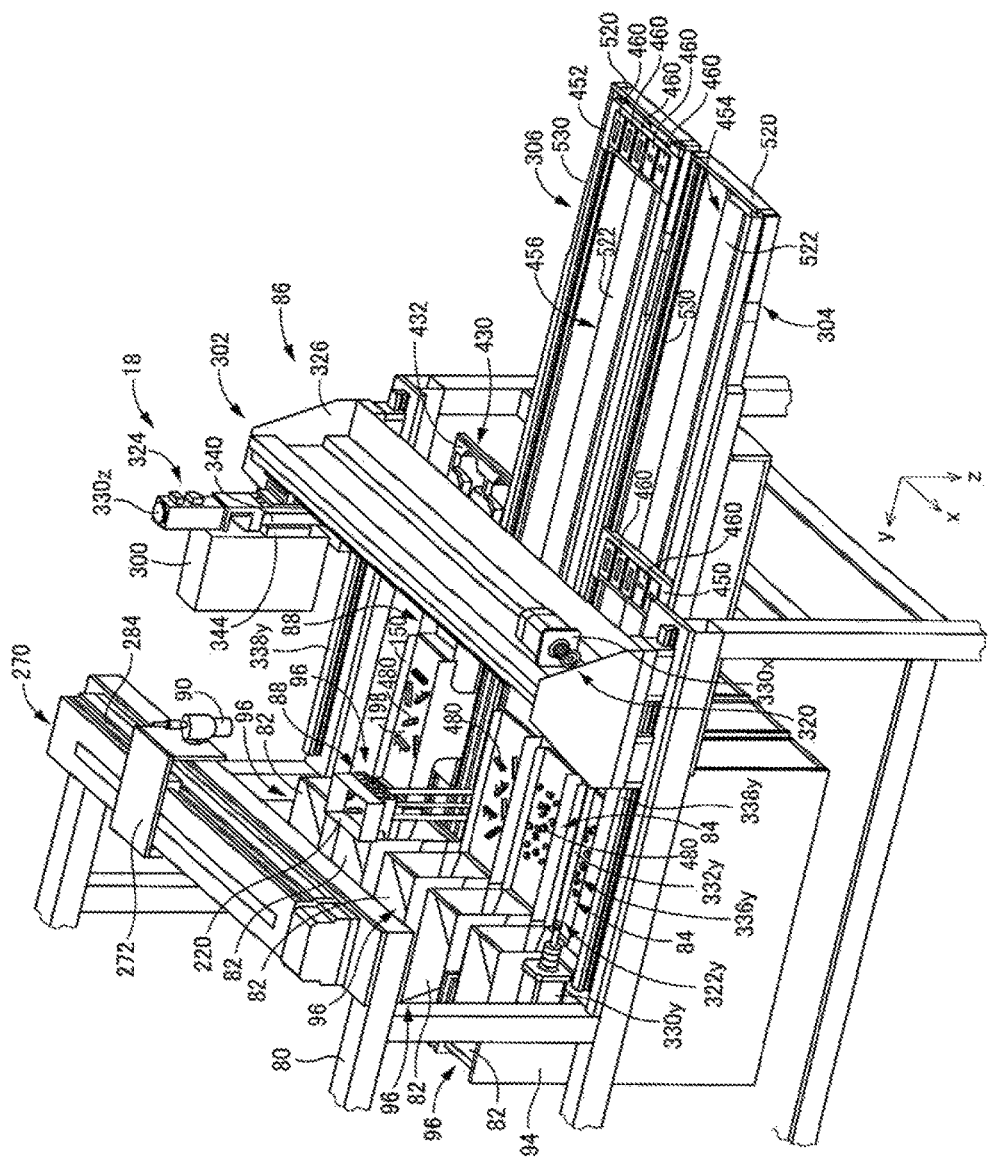
FIG. 3 is a perspective view showing the above loose component supply device.

Loose component supply device 18 arranges multiple components that are in a loose state, that is, in a state of random orientation, to have a specified orientation, to be in a state able to be transferred to component mounting device 20, that is, to be in a state able to be received by component mounting device 20. As shown in FIG. 1, the entirety or a portion of loose component supply device 18 is detachably provided on a rear section of device main body 10 behind board conveying and holding device 14. As shown in FIG. 3, loose component supply device 18 includes main body 80, component supply device 82, component scattering device 84, component transfer device 86, component returning device 88, and imaging device 90. Component supply device 82 is configured from component scattering device 84 and component returning device 88 both attached to shared frame 94. Hereinafter this configuration is also referred to as component supply unit 96. Multiple (in this embodiment, five) component supply units 96 are provided lined up in a row in a sideways direction (X direction) on main body 80.

Component Supply Device 82

Figure 4:
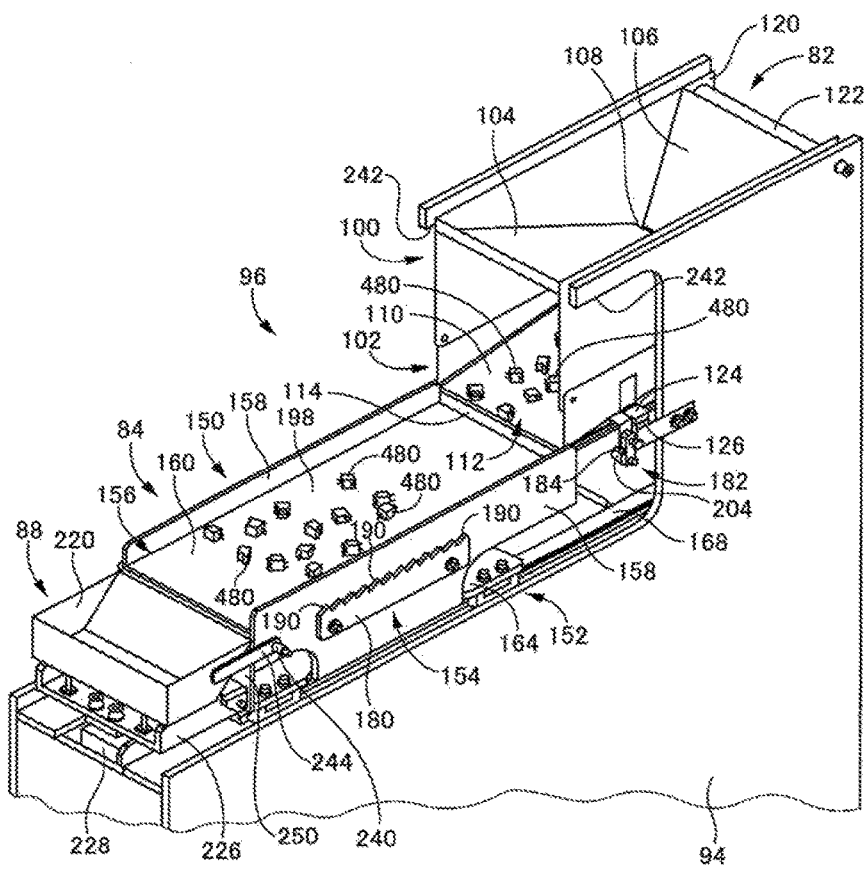
FIG. 4 is a perspective view showing a component supply unit of the above loose component supply device.
Figure 5:
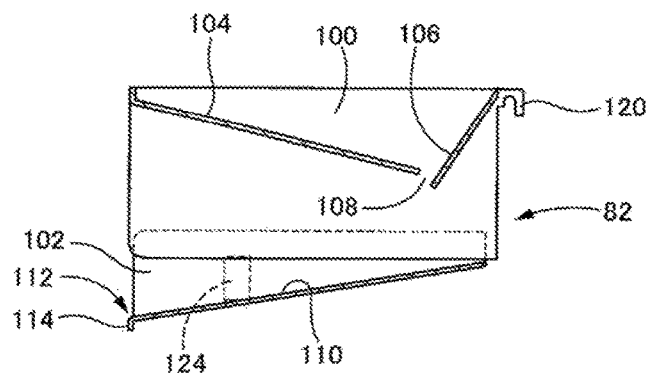
FIG. 5 is a side view cross section showing a component supply device of the above component supply unit.

As shown in FIG. 4, component supply device 82 includes component housing section 100 and component supply section 102. Component housing section 100 is provided on an upper section of component supply device 82, and is configured from a container that is open in the upwards direction, with the lower surfaces of the container configured from a pair of inclined surfaces 104 and 106. As shown in FIG. 5, inclined surfaces 104 and 106 are inclined to approach each other as they get lower, with the lower end section of each protruding downwards such that opening 108 extends in a sideways direction. Among inclined surfaces 104 and 106, inclined surface 104 provided at the front side of component supply device 82 has a gentler incline than inclined surface 106, and opening 108 is positioned at the rear section of component housing section 100. Component supply section 102 is provided with component supply surface 110 provided below component housing section 100. Component supply surface 110 is an inclined surface inclined downwards the further forwards it goes, and the leading end section thereof is configured from component ejection section 112. The incline of component supply surface 110 is gentler than that of inclined surface 104. Also, member 114 is provided on the front end of component supply surface 110 as a plate lip that extends downwards from component supply surface 110. The dimension of opening 108 in the front-rear direction is somewhat larger than the size of the components to be housed.

Figure 6:
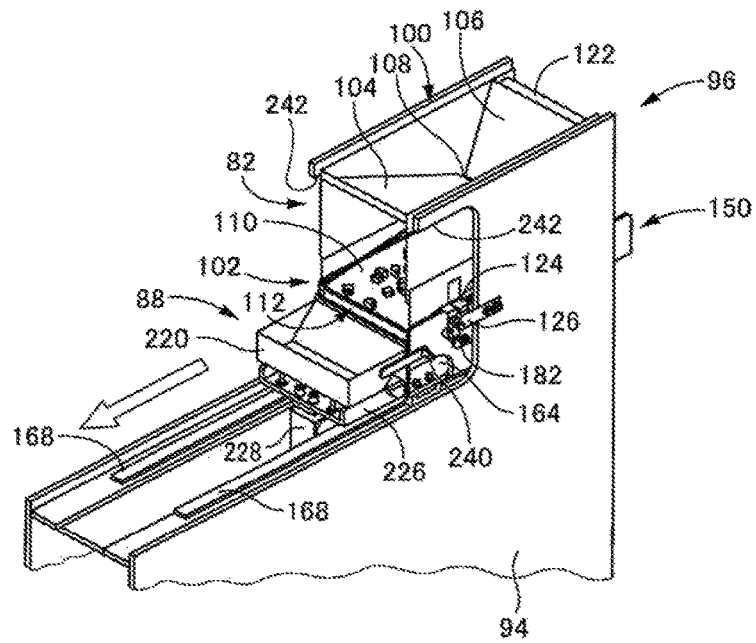
FIG. 6 is a perspective view showing a component support member positioned at a retract end position in the above component supply unit.

As shown in FIG. 4, with component supply device 82, pair of hooks 120 (one hook 120 is shown in FIG. 4) provided at both edge sections in the sideways direction of the upper rear section of component housing section 100 are engaged from above on support shaft 122 provided on the upper rear section of frame 94, and are supported to be detachable and rotatable around a horizontal axis line parallel to the sideways direction (X direction). Also, as shown in FIG. 6, component supply device 82 is provided with plate holding sections 124 that protrude horizontally, each provided on a lower section of the front sections of the pair of walls parallel to the front-rear direction, and is supported from below and rests on horizontal plate-shaped support sections 126 provided on frame 94 to be relatively movable in the vertical direction. In a state with component supply device 82 supported by frame 94, each of inclined surface 104 and component supply surface 110 are inclined at a predetermined angle with respect to a horizontal plane, in the present embodiment, around 15 degrees and around 10 degrees; lip member 114 is positioned in a vertical plane. There are multiple component supply devices 82 with a different dimension for opening 108 or a different inclination angle for at least one of the above inclined surfaces 104 and 106, and component supply surface 110, such that the components to be supplied by component supply unit 96 can be changed simply by exchanging component supply device 82.

Component Scattering Device 84

As shown in FIG. 4, component scattering device 84 includes component support member 150, component support member moving device 152 that is a relative moving device for moving component support member 150 and component supply device 82 relative to each other, and supply device oscillating device 154. Component support member 150 includes component support section 156 that is a long rectangular plate, and pair of leg sections 158. Leg sections 158 are flat plates and are provided protruding both above and below upper surface 160 that is the flat upper surface of component support section 156. Component support member moving device 152 includes slide 164 and slide driving device 166 (refer to FIG. 17). Slide driving device 166 is configured from a rodless cylinder in the present embodiment.

Component support member 150 is fixed to slide 164 at pair of leg sections 158; slide 164 is guided along pair of guide rails 168 by slide driving device 166 such that component support member 150 is moved parallel to upper surface 160, that is, horizontally, in the front-rear direction, just below the lower end of lip member 114. Also, as shown in FIG. 4, component support member 150 is moved to and from a component supply position at which the entirety of upper surface 160 is positioned forward of component supply device 82, and a retract position at which the front edge of upper surface 160 is positioned at the front edge of component supply device 82.

Figure 7:
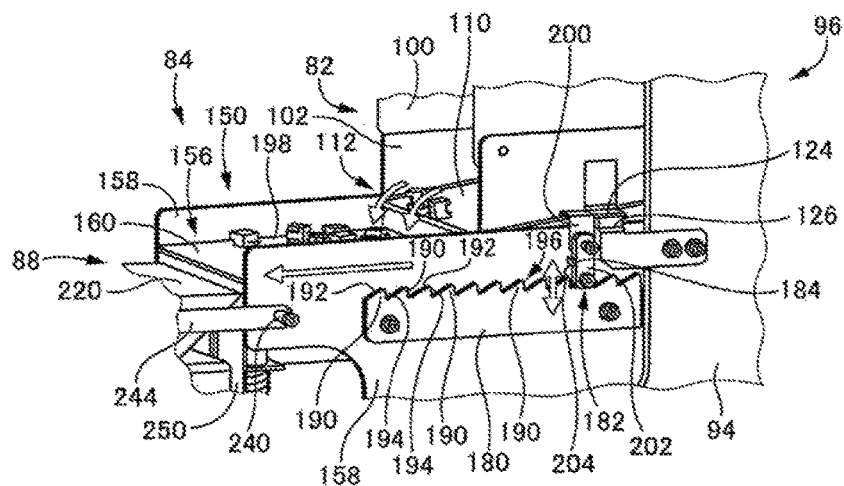
FIG. 7 is a perspective view showing a supply device oscillating device of a component scattering device of the above component supply unit.

As shown in FIG. 7, supply device oscillating device 154 of the present embodiment includes cam member 180, cam follower 182 and stopper 184 that configures a rotation limit regulating member. Cam member 180 is a flat plate and is fixed on an outer wall of one of the pair of leg sections 158 parallel to the front-rear direction. Multiple teeth 190 are provided on cam member 180 at a regular interval in a direction parallel to the front-rear direction. Each of multiple teeth 190 are configured from inclined surface 192 inclined to be higher the further it extends to the rear, and vertical surface 194 that extends vertically downwards from the upper end of inclined surface 192; cam surface 196 formed as multiple protrusions and recesses lined up in a straight line in a direction parallel to the front-rear direction is configured from these inclined surfaces 192 and vertical surfaces 194. As shown in FIG. 4, in the present embodiment, cam member 180 is provided on a portion of component support member 150 in the front-rear direction; among the range of upper surface 160, the portion in the front-rear direction corresponding to cam follower 180 functions as component support surface 198.

Figure 8:
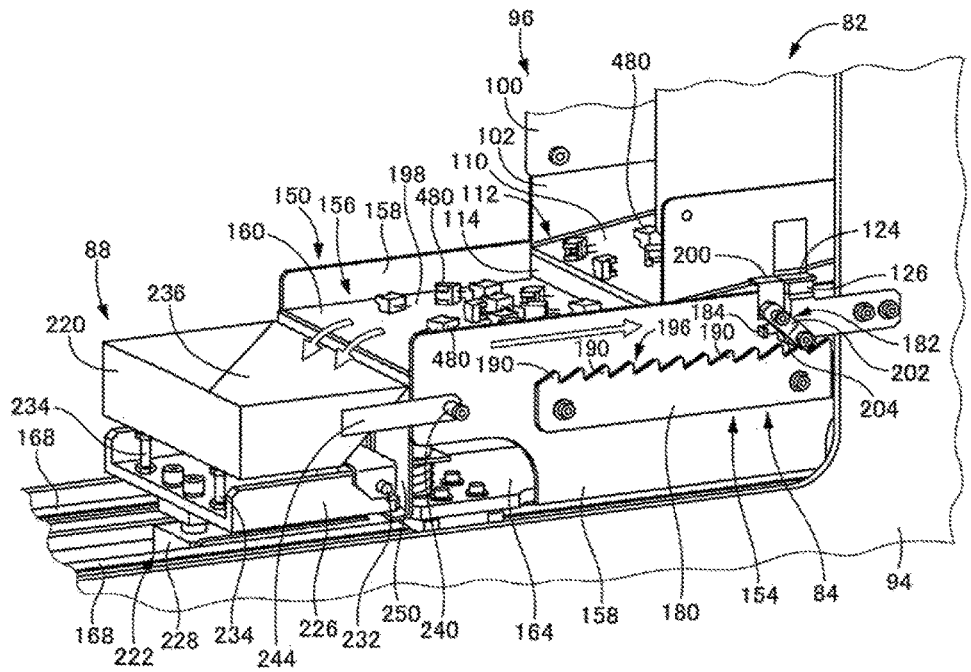
FIG. 8 is a perspective view of the above supply device oscillating device and a component returning device of the above component supply unit.

As shown in FIG. 8, cam follower 182 includes lever 202 provided on an outer surface of component supply device 82 to be rotatable around an axis line parallel to the sideways direction via bracket 200, and roller 204 provided on a free end of lever 202 to be rotatable around an axis line parallel to the sideways direction. Lever 202 is biased such that roller 204 moves forward by torsion coil spring 206 (refer to FIG. 9) that is a spring member forming a type of biasing means. Stopper 184 is provided on bracket 200 and forms a protrusion that regulates the rotation limit of lever 202 due to the biasing of torsion coil spring 206. As shown in FIG. 7, in a state with the rotation limit regulated, cam follower 182 is positioned to protrude downwards from component supply device 82 in a vertical direction.

Component Returning Device 88

Figure 11:
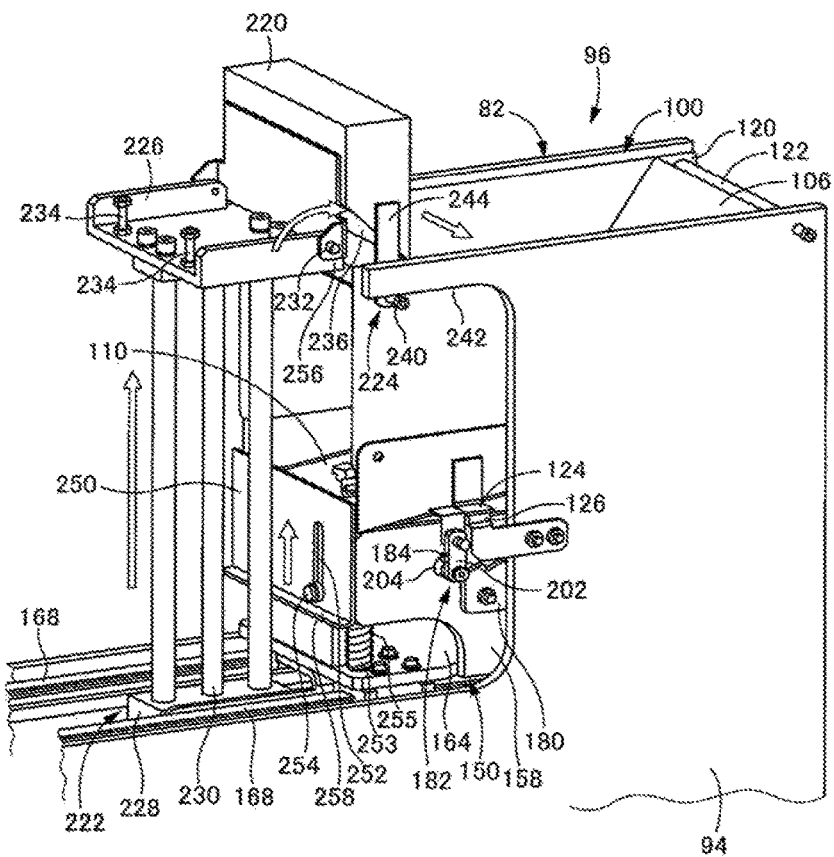
FIG. 11 is a perspective view showing a state in which a component collection container of the above component returning device is returning components to the component supply device.

As shown in FIG. 11, component returning device 88 includes lip member 114, component collection container 220, component collection container raising and lowering device 222 that forms a relative raising and lowering device, and operation conversion mechanism 224. Component collection container raising and lowering device 222 includes raising and lowering member 226 that forms a movable member, and air cylinder 228 that forms a raising and lowering member driving device. Air cylinder 228 is provided facing up at a position between the pair of guide rails 168; raising and lowering member 226 is raised and lowered with respect to component supply device 82 by the extending and retracting of piston rod 230. Air cylinder 228 is fixed to the front end of slide 164; raising and lowering member 226 is moved forwards and backwards together with component support member 150.

Figure 10:
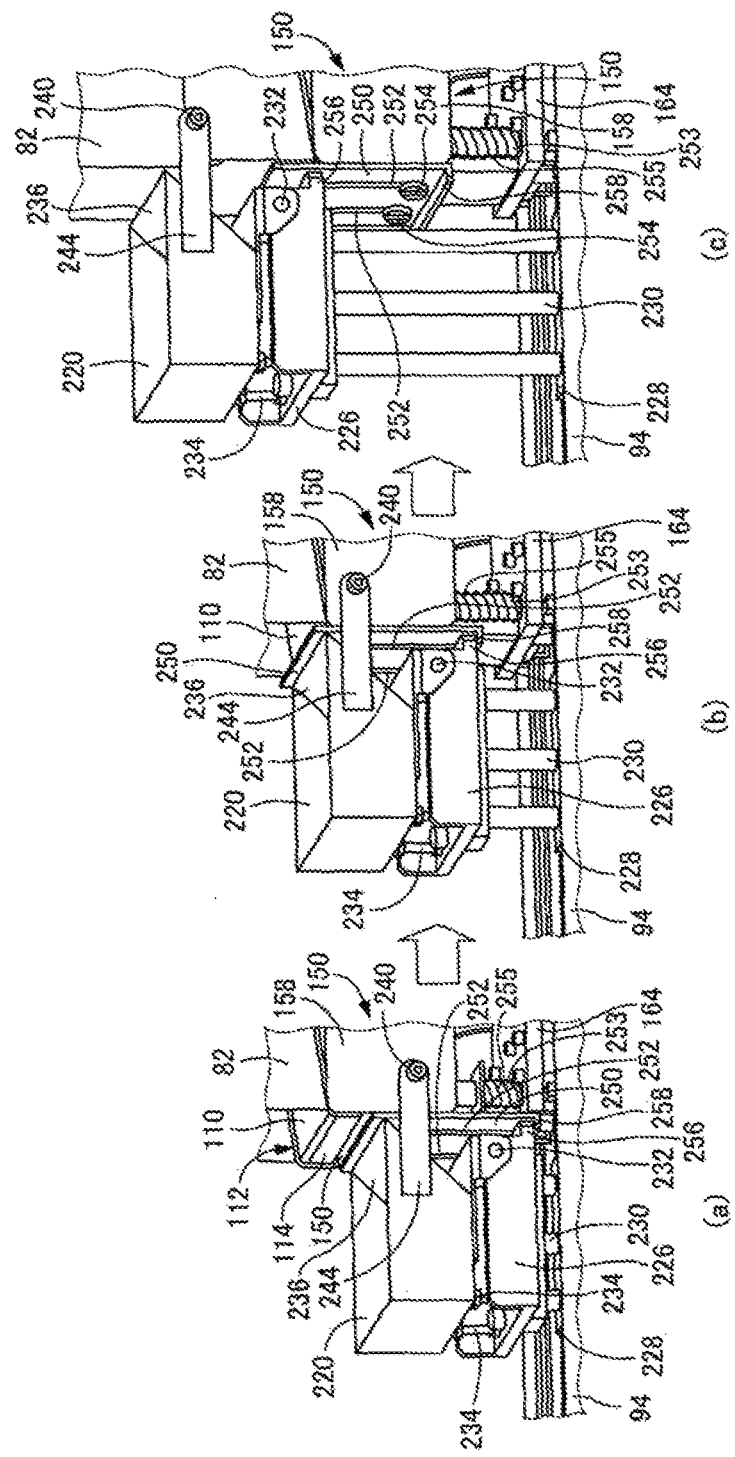
FIGS. 10A to 10C illustrate operation of returning components to the component supply device by the above component returning device.

Component collection container 220 is attached to raising and lowering member 226 via shaft 232 to be rotatable around an axis line horizontal and parallel to the sideways direction (X direction), and is provided to be raisable and lowerable on the front end section of component support member 150. Component collection container 220, by the raising and lowering of raising and lowering member 226, is raised and lowered to, as shown in FIG. 10A, a lower end position below upper surface 160 of component support member 150, and, as shown in FIG. 11, an upper end position above component supply device 82.

Also, component collection container 220 is rotated above raising and lowering member 226 to and from a component receiving position in which the lower surface of component collection container 220 is horizontal and the container is open upwards, and a component ejection position in which component collection container 220 is vertical, thus ejecting components to component supply device 82. Component collection container 220 is biased in a rotation direction towards the component receiving position by a torsion coil spring (not shown) that forms a biasing means. The rotation limit of component collection container 220 by this biasing is regulated by the pair of stoppers 234, and component collection container 220 is usually at the component receiving position. Rear wall 236 of component collection container 220 is inclined to point down the further it goes towards the rear at the component ejection position.

As shown in FIG. 11, operation conversion mechanism 224 includes pair of rollers 240 that form an engaging section provided on component collection container 220, and pair of engaged surfaces 242 that form an engaged section provided on frame 94. In FIG. 11, only one roller 240 and one engaged surface 242 are shown. As shown in FIG. 8, roller 240 is attached to a protruding end of fixed support member 244 that protrudes rearwards from component collection container 220 positioned at the component receiving position so as to be rotatable around an axis line parallel to the sideways direction. Engaged surface 242 is provided on a portion corresponding to the upper section of component housing section 100 of frame 94, and is a horizontal surface that faces downwards.

Shutter 250 is arranged on the leading edge of component support member 150 to be raisable and lowerable between component support member 150 and component collection container 220. Shutter 250 is raised and lowered in accordance with the raising and lowering of component collection container 220; the raising and lowering of shutter 250, as shown in FIG. 10C, is guided by protruding sections 254 provided on the leading edge of slide 164 engaging with pair of elongated holes 252 in a movable manner. Also, shutter 250 is biased upwards by compression coil spring 255 as a biasing means that engages with pair of rods 253 established on slide 164.

As shown in FIG. 10A, protruding engaging section 256 provided on the rear section of raising and lowering member 226 engages from above protruding engaging section 258 provided on the lower section of shutter 250 when component collection container 220 is at the lower end position. By this, the raising of shutter 250 due to the biasing force of compression coil spring 255 is prevented, and shutter 250 is held in a non-blocking positioning below upper surface 160 of component support member 150.

As shown in FIG. 10B, shutter 250 is allowed to move up in accordance with the upwards movement of component collection container 220. Shutter 250 moves up with the upwards movement of component collection container 220, but the raising limit of shutter 250 is regulated by the lower end of elongated holes 252 contacting protruding sections 254. Shutter 250 protrudes upwards higher than component supply surface 110 of component supply unit 96, to be in a blocking position that prevents components from falling from component supply surface 110.

Imaging Device 90

As shown in FIG. 3, imaging device 90 is, for example, provided with a CCD camera or a CMOS camera as an imaging instrument. Imaging device moving device 270 that moves imaging device 90 includes slide 272 and slide driving device 274 (refer to FIG. 17). Slide driving device 274 includes an electric motor, which is not shown, and indexing screw mechanism 278. Indexing screw mechanism 278 includes nut 280 and indexing screw 282; indexing screw 282 is rotated by the electric motor such that slide 272 is moved to any position in the sideways direction guided by guide rail 284. Slide driving mechanism 274 is provided on main body 80 such that imaging means 90 provided on slide 272 is positioned above component support surface 198 of component support member 150 positioned at the component supply position. Also, imaging device 90 has a lens pointing downwards and positioned opposite and facing component support surface 198.

Imaging device 90 is moved by imaging device moving device 270 to be positioned selectively facing each of component support surfaces 198 of the five sets of component supply units 96; at each of the five imaging positions, multiple components on the respective component support surfaces 198 are imaged.

The imaging region of imaging device 90 is determined by factors such as the characteristics of the lens and the distance to the imaging target; in the present embodiment, the region is set to include the entirety of component support surface 198. Thus, image data for the entirety of component support surface 198 can be acquired by imaging once with imaging device 90. Note that, the imaging area does not necessarily have to include the entirety of component support surface 198, a portion of component support surface 198 is sufficient. In cases in which the imaging region is a portion of component support surface 198 but it is necessary to acquire image data for the entirety of component support surface 198, imaging of component support surface 198 may be split between multiple imagings. In this case, it is desirable for imaging device moving device 270 to be able to move imaging device in a front-rear direction as well.

Component Transfer Device

Figure 12:
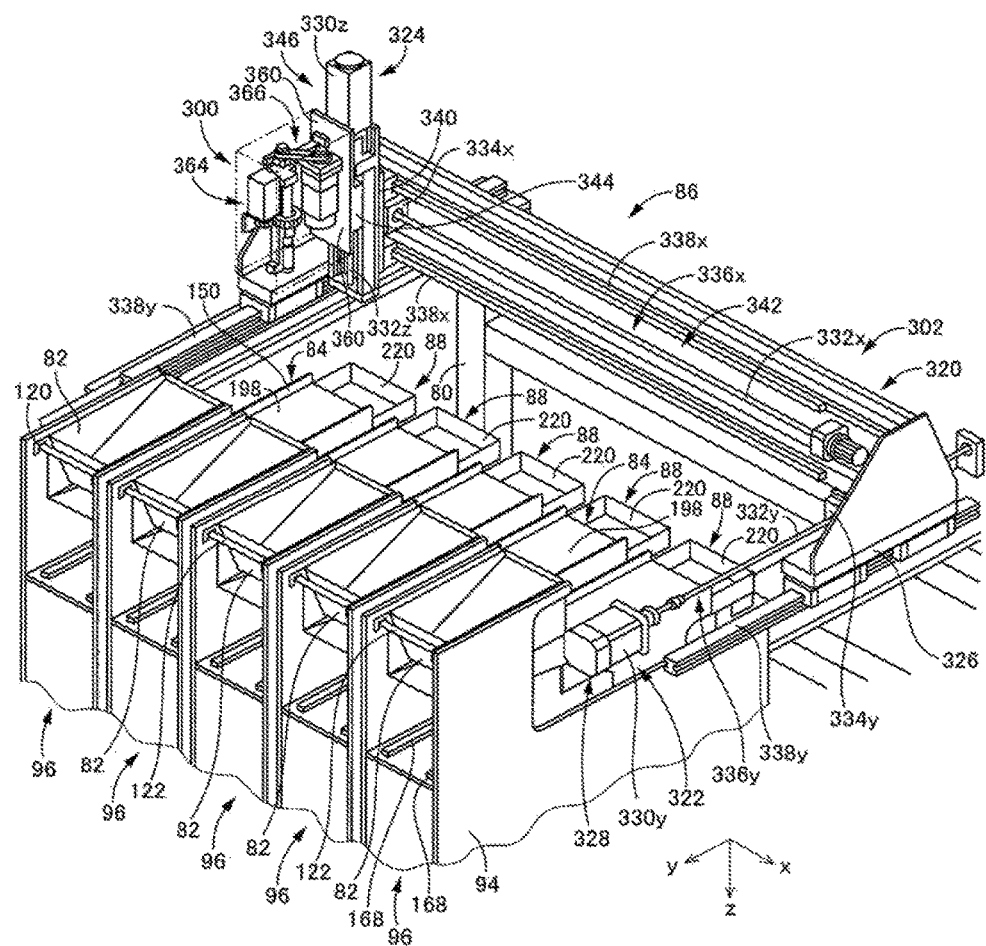
FIG. 12 is a perspective view showing a component holding head and component holding head moving device of a component transfer device.

As shown in FIG. 12, component transfer device 86 includes component holding head 300, component holding head moving device 302, and multiple (two in the present embodiment) shuttle devices 304 and 306 (refer to FIG. 3).

Component Holding Head Moving Device

Component holding head moving device 302 includes X-direction moving device 320, Y-direction moving device 322, and Z-direction moving device 324, and moves component holding head 300 in the X, Y and Z directions. Y-direction moving device 322 is provided on main body 80, and includes Y slide 326, and Y slide driving device 328. Y slide driving device is provided with electric motor 330y, and indexing screw mechanism 336y that includes indexing screw 332y and nut 334y; Y slide driving device 328 moves Y slide 326 provided to be movable as one with nut 334y to any position in the Y-axis direction guided by pair of guide rails 338y.

X direction driving device 320 is provided on Y slide 326 and includes X slide 340 and X slide driving device 342. Z direction driving device 324 is provided on X slide 340 and includes Z slide 344 and Z slide driving device 346. X slide driving device 342 and Z slide driving device 346 have a similar configuration to Y slide driving device 328, and configuration elements with the same reference numbers suffixed by x or z correspond to configuration elements of Y slide driving device 328 with the same use, thus descriptions of these are omitted.

Component Holding Head

Figure 13:
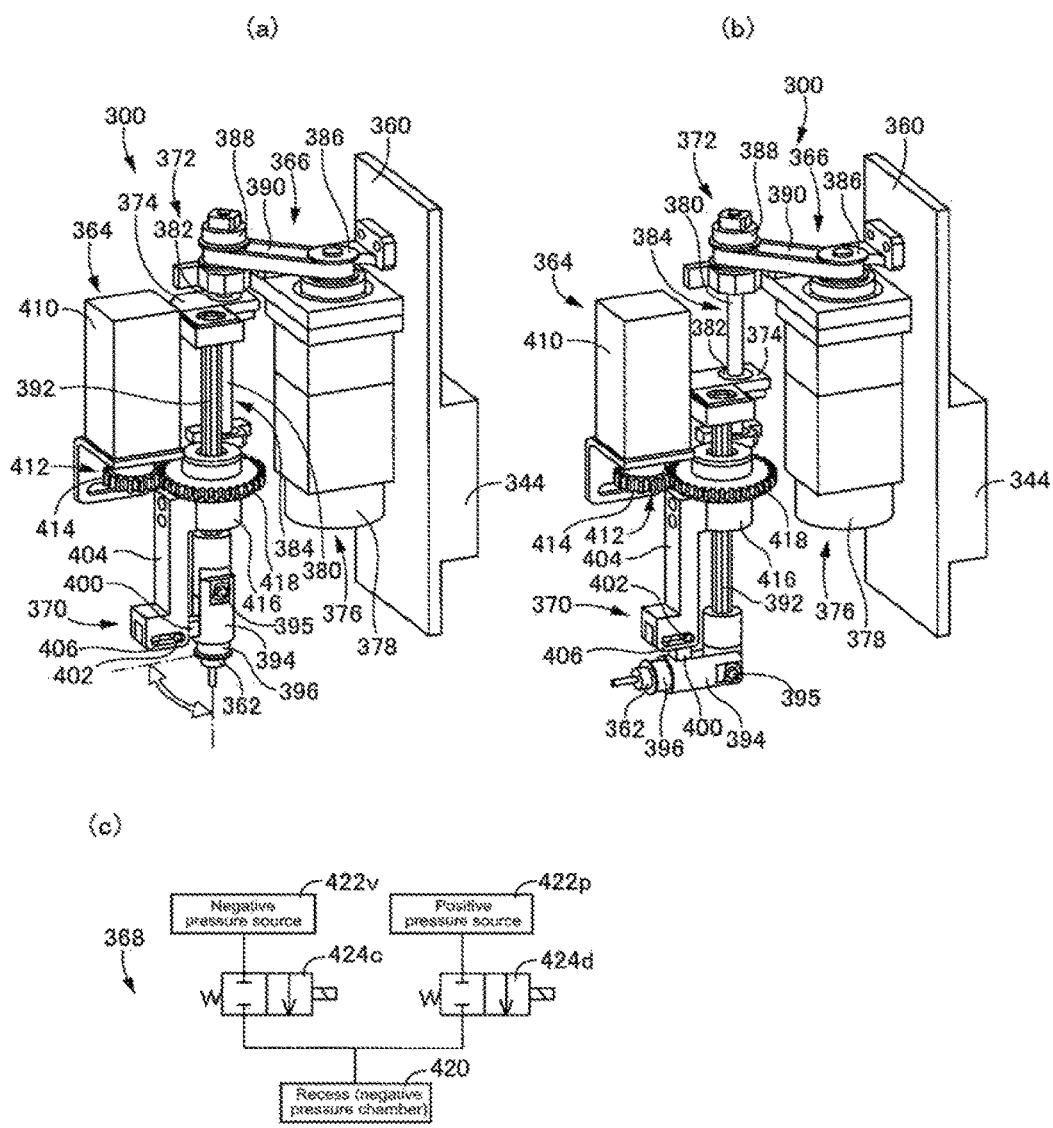
FIG. 13A is a perspective view of the above component holding head with a suction nozzle in a non-pivoted position.
FIG. 13B is a perspective view of the above component holding head with the suction nozzle in a pivoted position.
FIG. 13C is a conceptual view of a nozzle attachment device included in the above component holding head.

Component holding head 300 is provided on Z-axis slide 344. Component holding head 300 is moved by component holding head moving device 302 together with Z direction moving device 324 to a height region between imaging device 90 and component support surface 198. Within this height region, component holding head 30 is moved to any position in the horizontal and vertical directions. Thus, imaging device 90 and component holding head 300 are positioned above component support surface 198 of the same component supply unit 96 at the same time, and component holding head 300, by being moved in a horizontal direction that is at least one of the X and Y directions, is positioned above component support surface 198, and moved to and from a functional position at which a component can be picked up from component support surface 198, and a retract position separated from the functional position. As shown in FIGS. 13A,13B, and 13C, component holding head 300 includes (1) head main body 360 provided as one with Z slide 344, (2) suction nozzle 362 that forms a component holding tool, (3) nozzle rotating device 364 that forms a holding tool rotating device, (4) nozzle pivoting device 366 that forms a holding tool pivoting device, (5) nozzle attachment device 368 that forms a holding tool attachment device, and the like.

Nozzle pivoting device 366 pivots suction nozzle 362 around an axis line that extends in the horizontal direction, and includes link mechanism 370 and link mechanism driving device 372. Link mechanism driving device 372 includes raising and lowering member 374 that forms a driving member, and raising and lowering member driving device 376. Raising and lowering member driving device 376 is provided with electric motor 378 and indexing screw mechanism 384 that includes indexing screw 380 and nut 382; the rotation of electric motor 378 is transmitted to indexing screw 380 via timing pulleys 386 and 388 and timing belt 390, such that raising and lowering member 374 is raised and lowered. Spline shaft 392 is attached to raising and lowering member 374 extending vertically downwards. An end of lever 394 is attached to the lower end of spine shaft 392 via axis 395 so as to be rotatable around a horizontal axis line, and suction nozzle 362 is detachably held on the lower end of spline shaft 392 by nozzle holding member 396 that forms a component holding tool holding member.

Arm 400 is established on lever 394 in a direction at a right angle to the rotation axis of lever 394, and on a protruding end of arm 400 a pair of rollers 402 (only one roller is shown) is attached so as to be rotatable around an axis line parallel to the rotation axis line of lever 394, thus configuring a cam follower. Each of the pair of rollers 402 is engaged with pair of horizontal elongated holes 406 (only one elongated hole 406 is shown) of cam member 404 provided on head main body 360 so as to be not movable in the vertical direction. As shown in FIG. 13A, in a state in which raising and lowering member 374 is at the upper limit position, suction nozzle 362 is in a non-pivoted position aligned with spline shaft 392. When raising and lowering member 374 is lowered, lever 394 is rotated due to the lowering of rollers 402 being prevented by cam member 404, such that suction nozzle 362 is pivoted around a horizontal pivoting axis line. In a state in which raising and lowering member 374 is lowered to the lower limit position, as shown in FIG. 13B, suction nozzle 362 is pivoted 90 degrees and the axis line of suction nozzle 362 is horizontal. The non-pivoted position and the 90 degree pivoted position are decided by position control of raising and lowering member 374 performed by control of electric motor 378. Suction nozzle 362 is also able to be held at any position between the non-pivoted position and the 90 degree pivoted position.

Nozzle rotating device 364 includes electric motor 410, which is attached to head main body 360 via an attachment member that is not shown, and rotation transmitting device 412. Rotation transmitting device 412 includes gear 414 attached to an output shaft of electric motor 410, and fixed gear 418 that is fixed to spline member 416 engaged with spline shaft 392 so as to be movable in an axis direction and not rotatable; rotation transmitting device 412 rotates spline shaft 392 around a vertical axis line to any angle in forward and reverse directions. Rotation is transmitted to spline shaft 392 at whichever position in the vertical direction, such that suction nozzle 362 is rotatable to any angle around a vertical axis line that is an axis perpendicular to the horizontal component surface 198. Cam member 404 is fixed to spline member 416, and is rotated together with spline shaft 392 and suction nozzle 362 such that suction nozzle 362 is able to be pivoted at any rotational position.

Nozzle attachment device 368 is configured such that suction nozzle 362 is detachably attached to nozzle holding member 396. As shown in FIG. 13C, nozzle attachment device 368 includes (1) recess section 420 provided in the surface of nozzle holding member 396 that contacts suction nozzle 362, (2) negative pressure source 422v and positive pressure source 422p, (3) and electromagnetic valves (in the present embodiment an electromagnetic opening and closing valve) 424c and d provided between each of recess section 420 and negative pressure source 422v, and recess section 420 and positive pressure source 422p; negative pressure and positive pressure are selectively supplied to recess 420 by controlling electromagnetic valves 424c and d. When negative pressure is applied in a state with the opening of recess section 420 covered due to suction nozzle 362 contacting the contact surface of nozzle holding member 396, a negative pressure chamber is formed by recess section 420 and the like. This negative pressure chamber causes suction nozzle 362 to be attached to nozzle holding member 396 in a state with negative pressure maintained, while suction nozzle 362 is released by positive pressure being supplied to recess section 420.

Suction nozzle 362 picks up and holds a component using negative pressure; there are multiple types of suction nozzles 362 with different sizes of pickup pipe pickup surfaces (for example, these can be represented by a nozzle diameter, which is the diameter of the nozzle pipe). Because the strength of the negative pressure supplied to suction nozzle 362 is substantially regular, components can be held by a larger force (hereinafter also referred to as holding force) the larger the nozzle diameter is. As shown in FIG. 3, nozzle housing device 430 that houses multiple types of suction nozzles 362 with different nozzle diameters is provided on main body 80. Nozzle housing device 430 includes nozzle holding member 432 that has multiple recesses capable of housing a suction nozzle 362, shutter moving device 434 (refer to FIG. 17) that moves a shutter, which is not shown, provided on an upper surface of nozzle holding member 432 to and from a removal prevention position and a removal allowance position. Component holding head 300 is moved to nozzle housing device 430 as required such that suction nozzles 362 can be exchanged automatically.

Shuttle Device

Figure 14:
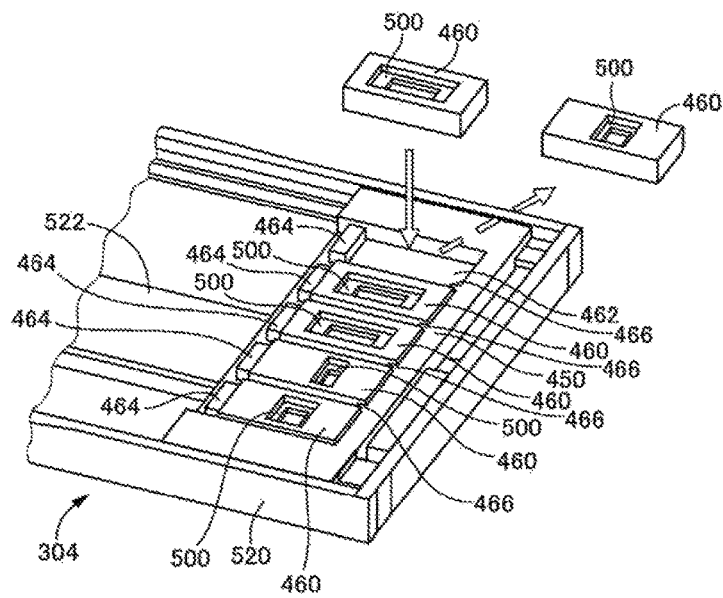
FIG. 14 is a perspective view of a component carrier of a shuttle device of the above component transfer device.

As shown in FIG. 3, shuttles 304 and 306 each include component carriers 450 and 452, and component carrier moving devices 454 and 456, and are provided lined up in the sideways direction on the front side of component supply unit 96 of main body 80. In the present embodiment, component receiving member 460 is provided on each of carrier 450 and 452, with multiple (in the present embodiment, five) thereof being detachably held lined up in the sideways direction. As shown in FIG. 14, component receiving member 460 engages with recess section 462 of component carriers 450 and 452, and is positioned respectively in the front-rear direction and the sidewards direction by protruding sections 464 and 466.

Figure 16:
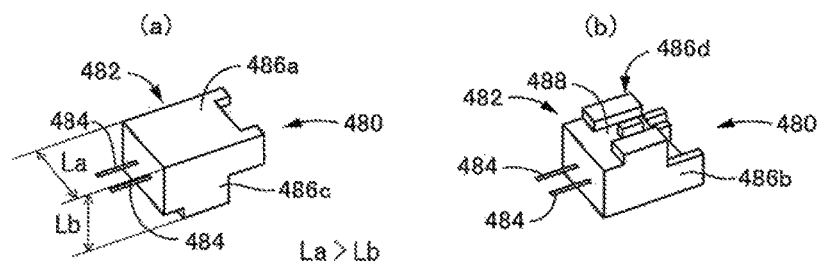
FIG. 16 are perspective views of an example component supplied by the above loose component supply device.

In the present embodiment, electronic circuit components with leads (hereinafter also referred to as leaded components) 480 shown in FIGS. 16A and 16B are supplied by loose component supply device 18. Leaded components 480 are configured from component main body 482, which is block-shaped, and two leads 484 that protrude from the bottom surface of component main body 482.

Figure 15:
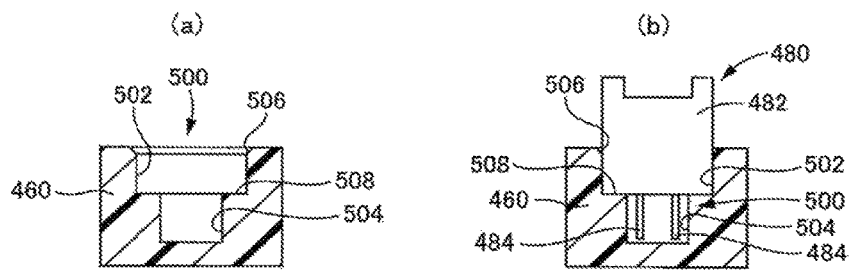
FIG. 15A is a front side cross section showing a component receiving member of the above component carrier.
FIG. 15B is a front side cross section showing a state with a leaded component stored in the above component carrier.

As shown in FIG. 14, component reception recess 500 is provided in component receiving member 460. Component reception recess 500 is provided in accordance with the shape and size of the component to be housed, and component reception recess 500 of component receiving member 460 into which a leaded component can enter includes, for example, as shown in FIG. 15A, main body reception recess 502 opening at the upper surface of component receiving member 460, and lead reception recess 504 opening at the lower surface of main body reception recess 502. The surface is cut away at the opening edge section of main body reception recess 502, such that guidance surface 506 that guides the entry of the component is formed, thus configuring a guiding section. As shown in FIG. 15B, leaded component 480 is housed in lead reception recess 504 with leads 484 pointing downwards by component receiving member 460; component main body 482 is positioned in the horizontal direction by engaging with main body reception recess 502, and is supported from below by upward facing component support surface 508 configured from the bottom surface of main body reception recess 502, and is received in a state positioned in the vertical direction.

As shown in FIG. 14, there are multiple types of component receiving members 460 with component reception recesses 500 of different sizes and shapes, which are exchanged by operators. A component receiving member that has the dimensions of multiple component receiving members 460 may be held by component carriers 450 and 452.

As shown in FIG. 3, component carrier moving devices 454 and 456 have a similar configuration, thus only one will be described; for the other, the same reference numbers apply to corresponding configuration elements, and descriptions are omitted.

Moving device main body 520 of component carrier moving device 454 is provided with endless belt 522 and belt rotating device 524 (refer to FIG. 17) provided on main body 80 parallel in a front-back direction. Belt 522 is wound around multiple pulleys that are rotatable around an axis line parallel to the sideways direction of moving device main body 520, and are locked to component carrier 450. Belt 522 is rotated by the pulleys being rotated by an electric motor (not shown), such that component carrier 450 is moved in a front-rear direction being guided by pair of guide rails 530 (one guide rail 530 is shown in FIG. 3) Component carriers 450 are each moved independently to and from a component receiving section positioned at a front section among the moving range of component holding head 300, close to component holding head moving device 302, and adjacent to component supply unit 96, and a component receiving position positioned at a rear section of the moving range of mounting heads 50 and 52 close to component mounting device 20. Component carrier 450 is positioned at the component receiving position and the component transfer position by a stopper (not shown) provided on moving device main body 520.

Control Device

Figure 17:
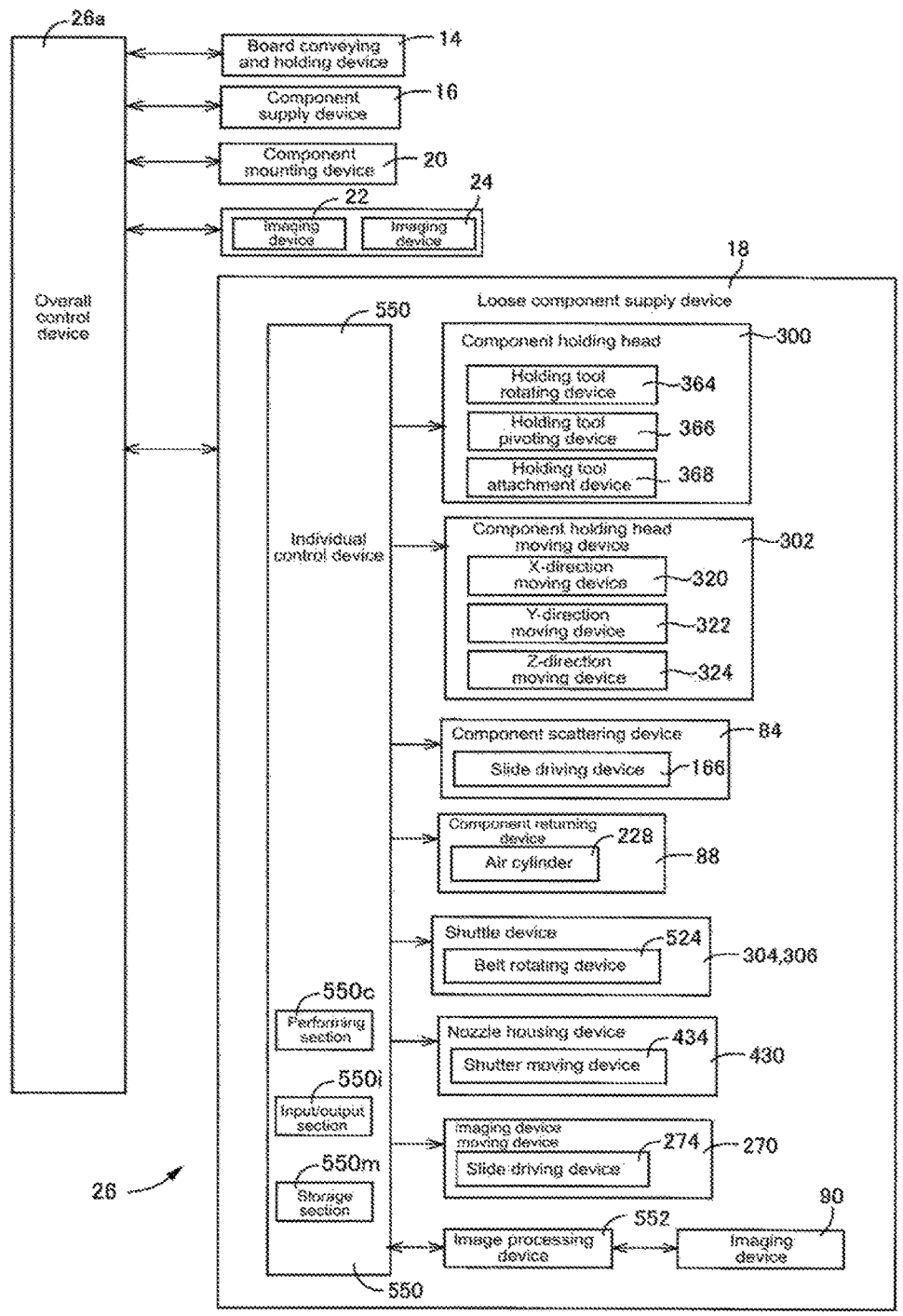
FIG. 17 is a block diagram conceptually showing control devices of the above component mounter.

As shown in FIG. 17, control device 26 includes (a) overall control device 26a, (b) individual control devices (only individual control device 550 of loose component supply device 18 is shown) of board conveying and holding device 14, component supply device 16, loose component supply device 18, and the like, and (c) imaging processing device 552 as an image data processing device, and the like. Overall control device 26a, individual control devices 550 and the like, and imaging processing device 552 are configured mainly from a computer, and are connected so as to be able to communicate with each other. Overall control device 26a performs overall control of board conveying and holding device 14, component supply device 16, loose component supply device 18, component mounting device 20, and the like, via the individual control devices 550.

For loose component supply device 18, individual control devices 550 are provided with performing section 550c, input/output section 550i, and storage section 550m; imaging device moving device 270, component holding head 300 of component transfer device 86, component holding head moving device 302, nozzle housing device 430, shuttle devices 304 and 306, image processing device 552, and the like are connected to individual control devices 550.

Note that, the configuration of control device 26 is not limited to that of the present embodiment. For example, it is possible to not provide overall control device 26a, and to instead control each device 14, 16, 18, 20, and so on with individual control devices 550 or the like (it is desirable that individual control devices be able to communicate with each other); or it is possible not to provide individual control devices 550, and to instead control each device 14, 16, 18, 20, and the like using overall control device 26. Also, image processing device 552 may be configured as part of an individual control device 550 or as part of overall control device 26a.

Operation

Board 12 is loaded into the component by board conveying and holding device 14, and then stopped and clamped at a predetermined position. Next, mounting heads 50 and 52 are moved to assemble components supplied by component supply device 16 and loose component supply device 18 on board 12.

In loose component supply device 18, leaded components 480 are supplied by five sets of component supply units 96. Because component supply operation is the same for each of these five component supply units 96, operation will be described for one set of the five sets of component supply units 96.

Multiple of the same type of leaded components 480 are inserted into component housing section 100 of component supply device 82 by an operator. When components are inserted, as shown in FIG. 6, component support member 150 is in the retract position. With component insertion, some components pass through opening 108 and fall on component supply surface 110, then move to the component ejection section 112 side via the incline of component supply surface 110, and are spread out on component supply surface 110. If leaded components 480 get stuck and blocked in opening 108, components are stopped from falling onto component supply surface 110, and multiple leaded components 480 inside component housing section 100 are housed in a loose state in a random orientation stacked on each other. Even if leaded components 480 that have fallen onto component supply surface 110 move beyond component ejection section 112, they are housed in component collection container 220. Component collection container 220 is positioned together with component support member 150 at the retract position, and is at the lower limit position, that is, the component receiving position.

After components are inserted, component support member 150 is advanced and moved forwards from below component supply device 82. When cam member 180 contacts cam follower 182, roller 204 moves up in accordance with inclined surface 192 of tooth 190, then when reaching vertical surface 194, drops down after riding over tooth 190. Cam follower 182 is biased to engage with tooth 190 by a tension coil spring and the rotational limit is regulated by stopper 184; when component support member 150 is advanced, roller 204 is maintained in a state engaged with tooth 190, as shown in FIG. 7, without lever 202 being rotated, cam follower 182 rides over tooth 190 together with component supply device 82. Cam follower 182 rides over multiple teeth 190 one by one, and by the repeated raising and lowering the front section of component supply device 82 is raised and lowered, thus being oscillated in the vertical direction. Here, the lifting up from support shaft 122 of component supply device 82 is reversed by the weight of component supply device 82 itself.

Components on component supply surface 110 are moved forward by the incline of component supply surface 110 and the oscillating, and as shown in FIG. 7, are ejected from component ejection section 112 onto component support surface 198. Here, leaded components 480 are prevented from falling by the pair of leg sections 158 that protrude up from upper surface 160. Also, by the oscillation of component supply device 82, leaded components 480 stuck in opening 108 are scattered and thus fall onto component supply surface 110, and leaded components inside component housing section 100 pass through opening 108 and are ejected by falling onto component supply surface 110. In accordance with the advancing of component support member 150, a different portion of component support surface 198 is consecutively made to correspond with component ejection section 112, thus the surface area of component support surface 198 is increased, such that leaded components 480 are supported consecutively. The advancing direction of component support member 150 is the forward direction, and the retracting direction is the reverse direction; while component support member 150 is being advanced, component supply device 82 is oscillated only when cam follower 204 rides over cam member 180, such that leaded components 480 are ejected from component ejection section 112. Cam member 180 separates from cam follower 182 before component support member 150 reaches the component supply position, and component support member 150 is advanced, but component supply device 82 is not oscillated and components are not ejected. Thus, with component support member 150 arrived at the component supply position, among upper surface 160, multiple of the same type of leaded components 480 are supported on component support surface 198 in a scattered state.

After component support member 150 is stopped, imaging device 90 is moved and the multiple leaded components 480 on component support surface 198 are imaged. The multiple leaded components 480 are the same as each other and are in a scattered state. In the present embodiment, pickup target components are determined based on the image data that is acquired by the imaging by imaging device 90. Also, those pickup target components are picked up and held by suction nozzles 362 according to parameters (conditions) acquired based on the image data, component holding head 300 is moved by holding head moving device 302, and leaded components 480 are held by component receiving member 460 of component carriers 450 and 452. The multiple leaded components 480 scattered on component support surface 198 are aligned on component carriers 450 and 452.

Determination of Pickup Target Components and Determination of Pickup and Transport Conditions Determination of Pickup Target Components For leaded components 480, as shown in FIGS. 16A and 16B, component main body 482 is configured from four side surfaces 486 at right angles to each other. Thus, in a state in which a leaded component 480 is resting on component support surface 198 on one of the four sides 486, the upward-facing surface opposite to that surface is parallel to component support surface 198, and leads 484 are parallel to component support surface 198. Also, three of the four sides 486 (486a, 486b, and 486c) are configured from pickup surfaces that cover the opening of the suction pipe of suction nozzle 362 and that have a surface area able to be picked up that prevents leaking of the negative pressure. However, one of the surfaces 486 (486d), as shown in FIG. 16B, is provided with indent 488, which makes pickup difficult even if a pickup nozzle with a small nozzle diameter is used.

Figure 18:
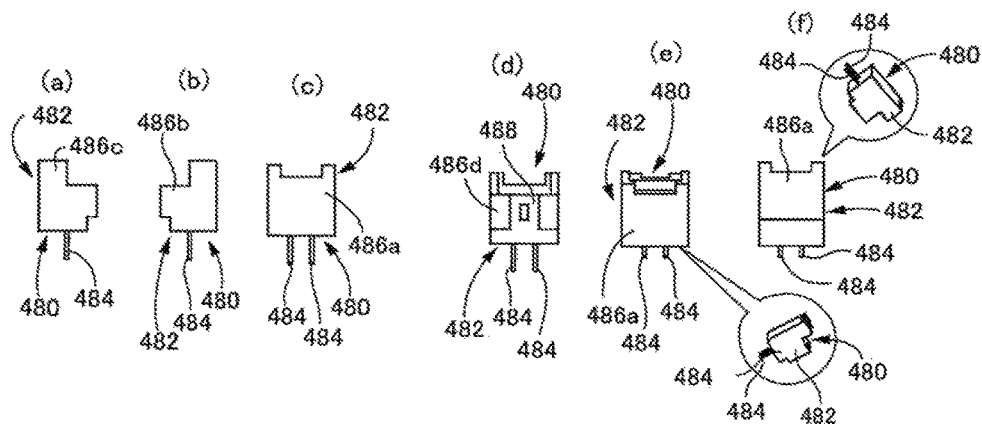
FIGS. 18A to 18F show the size and shape from above of a component in a loose state supported on a component support section.

Due to this, leaded components 480 that are oriented such that leads 484 extend parallel to component support surface 198, independent from other leaded components 480, and, as shown in FIGS. 18A to 18C, are oriented with side surface 486c, 486b, or 486a, for which pickup is possible, facing upwards, are pickup target components 480t (hereinafter, among leaded components 480, pickup target components are designated by a lower case t). Conversely, as shown in FIGS. 18D to 18F, leaded components with an inclined orientation and leaded components 480 with leads 484 parallel to component support surface 198 but with difficult-to-pickup side surface 486d facing upwards, are non-pickup target components 480s (hereinafter, among leaded components 480, non-pickup target components are designated by a lower case s). Hereinafter, side surface 486a is sometimes referred to as the front surface, and side surface 486d as the rear surface.

Nozzle Selection

For example, the surface area of the portion that can be picked up by suction nozzle 362 differs for each of side surfaces 486a to 486c that can be picked up. The surface area of the portion of side surface (front surface) 486a that can be picked up is large, while the surface area of the portion of side surfaces 486b and 486c that can be picked up is small. Thus, as shown in FIG. 18C, for pickup target components 480t oriented with side surface (front surface) 486a facing upwards, a pickup nozzle 362 with a large nozzle diameter is selected; and as shown in FIGS. 18A and 18B, for pickup target components 480t oriented with side surface 486b or 486c facing upwards, a pickup nozzle 362 with a small nozzle diameter is selected.

Pickup Height

Figure 19:
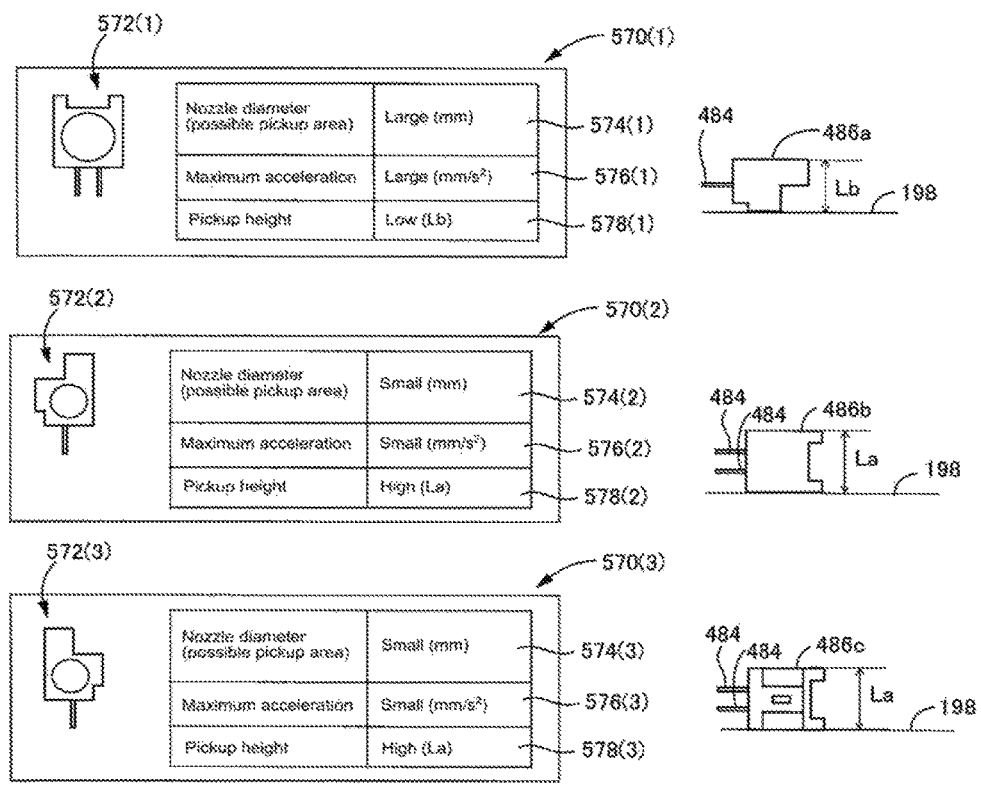
FIG. 19 is a conceptual diagram showing component data stored in a storage section of the above control device.

Even for the same leaded component 480, depending on the orientation, because the height (which is the height from component support surface 198 to the surface facing upwards [non-supported surface], hereinafter referred to simply as height) is different, the height of the opening at the lower end of the suction pipe of suction nozzle 362 during pickup is determined depending on the orientation. As shown in FIG. 16A and FIG. 19, the height of leaded component 480 oriented with front surface 486a facing upwards is Lb, while the height for leaded component 480 oriented with side surfaces 486b or 486c facing upwards is La. For this leaded component 480, La is larger than Lb (La>Lb).

Maximum Acceleration Level

As described above, the holding force of leaded component 480 by suction nozzle 362 is larger for large nozzle diameters than it is for small nozzle diameters. Also, for leaded components 480 of the same mass held by suction nozzle 362, a leaded component 480 is less likely to separate from suction nozzle 362 due to a large inertial force, that is, a large acceleration, for a large holding force compared to for a small holding force. Thus, the transport acceleration of component holding head 300 can be larger for a large nozzle diameter than a small nozzle diameter. From the above, the maximum value of the transport acceleration that can be used (allowable transport acceleration) is larger when a pickup nozzle with a large nozzle diameter is selected than when a pickup nozzle with a small nozzle diameter is selected.

Component Data

Component data 570(*n*) (n=1, 2, 3) is predetermined data of each of pickup target components 480*t* shown by FIGS. 18A to 18C, which are a portion of the multiple leaded components 480, and is based on the orientation of the leaded components 480. This component data 570(*n*) is stored in storage section 550*m* of individual storage device 55. Component data 570(1) relates to pickup target component 480*t*(1) for which front surface 486*a* is facing upwards (the suffix (1) is added to correspond to the component data; a similar suffix is added to the other pickup target components); component data 570(2) and (3) relate to pickup target components 480*t*(2) and (3) for which side surfaces 486*b* and *c* respectively are facing upwards. As shown in FIG. 19, each component data 570 contains [1] shape data 572(*n*) that represents the plan view shape (including the shape of the upward facing surface), and [2] data that represents conditions (parameters) that relate to transport of component head 300 and pickup of pickup target component 480*t*. Data that represents parameters of [2] (hereinafter also referred to as parameters related to pickup and so on of pickup target component 480*t*) includes at least one of (i) nozzle diameter data 574(*n*) that represents the nozzle diameter (pickup nozzle type) of pickup nozzle 362 used to pick up pickup target component 480*t* (which is an example of holding tool type specification data), (ii) maximum acceleration data 576(*n*) that represents the maximum value (control value) of acceleration (which includes an absolute value of the deceleration) for transporting component holding head 300 that is holding a leaded component to component receiving member 460 positioned at the component receiving position, and (iii) pickup height data 578(*n*) that represents the pickup height (the height of the opening at the lower end of the suction pipe of suction nozzle 362) when suction nozzle 362 picks up pickup target component 480*t*.

Image Data

Figure 20:
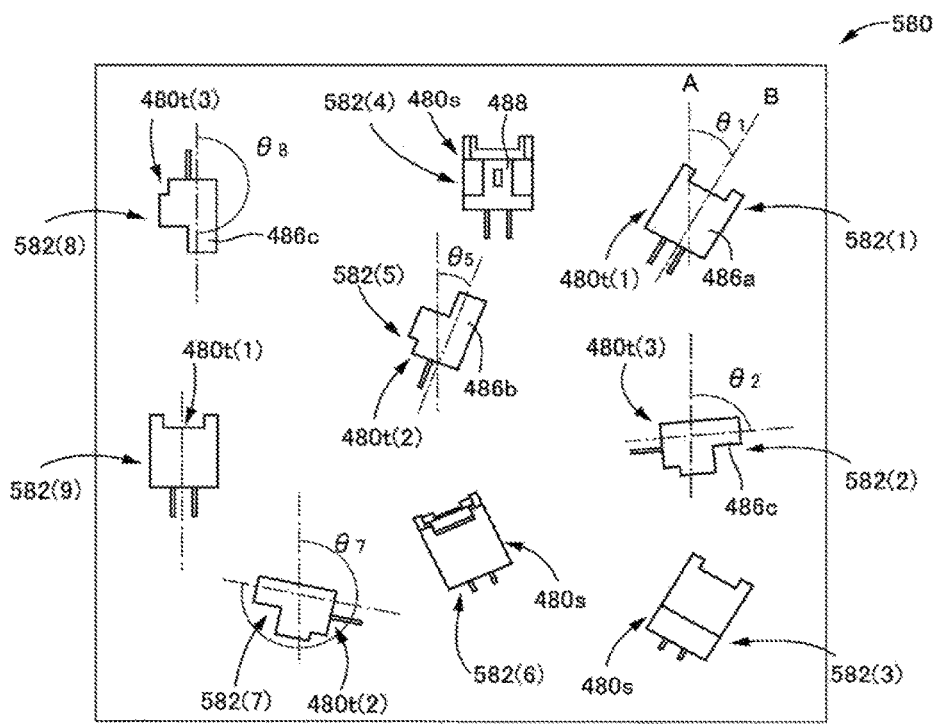
FIG. 20 conceptually illustrates image data.

An example of image data is shown conceptually in FIG. 20. As shown in FIG. 20, individual image data 582(*k*) (k=1, 2, 3 . . . ) that is multiple image data that corresponds to each of the multiple leaded components 480 is included in image data 580. Individual image data 582(*k*) is image data that represents the size and shape of each plan view of leaded component 480. It is possible to determine whether each leaded component is a pickup target component based on individual image data 582(*k*).

Image Processing (I) Image data 580 is processed based on component data 570(1). From component data 570(1), shape data 572(1) and individual image data 582(*k*) (k=1, 2, 3 . . . ) are compared with each other, and individual image data 582(*k*) that matches shape data 572(1) of component data 570(1) is extracted. Then, leaded component 480 that corresponds to matching individual image data 582(*k*) is set as pickup target component 480*t*(1). When comparing, at least one of shape data 572(1) and individual image data 582(1) is rotated. Then, based on at least one of the rotation angles that matches, the orientation (angle θ) of pickup target component 480*t*(1) is determined. Angle θ is the angle between reference line A with XY coordinates (for example, a line parallel to the X direction or Y direction), and reference line B of individual image data 572(*k*) (for example, this may be a line parallel to lead 484) (for example, the angle may be defined based on positive angles being in a clockwise direction). Also, the XY coordinate position of individual image data 572(*k*) is acquired based on image data that corresponds to a predetermined reference position mark (for example, which may be formed on component support surface 198 or the like); the XY coordinate position of pickup target component 480*t*(1) corresponding to individual image data 572(*k*) is acquired. The above acquired data representing the angle θ and data representing the XY coordinate position of pickup target component 480*t* (hereinafter also referred to as position and angle data) is stored.

Also, parameters related to pickup and so on of pickup target component 480*t*(1) are decided as, among component data 570, nozzle diameter data 574(1), pickup height data 578(1), and maximum transport acceleration data 576(1).

(II) Image data 580 is processing based on component data 570(2). From component data 570(2), shape data 572(2) and individual image data 582(*k*) (or, from individual image data 582(*k*), items excluding items determined as pickup target component 480*t*(1)) are compared, and items that match shape data 572(2) are extracted. Leaded components 480 that correspond to extracted individual image data 582(*k*) are set as pickup target component 480*t*(2), the XY coordinate positions and angle θ of each pickup target component 480*t*(*t*) are acquired, and the position and angle θ data is stored. Also, parameters related to pickup and so on of pickup target component 480*t*(2) are decided as, among component data 570, nozzle diameter data 574(2), pickup height data 578(2), and maximum transport acceleration data 576(2).

(III) Image data 580 is processed based on component data 570(3). In a similar manner, components corresponding to individual image data 582(*k*) that matches shape data 572(3) of component data 570(3) are set as pickup target components 480*t*(3), and the position and angle data is acquired and stored. Further, parameters related to pickup and so on of pickup target component 480*t*(3) are determined based on component data 570(3).

As described above, image processing is performed multiple times, and in the present embodiment, processing that determines pickup target component 480*t*(*n*) by comparing each of shape data 572(*n*) of component data 570(*n*) and individual image data 582(*k*), and acquiring the orientation of a leaded component corresponding to individual image data 582(*k*) is considered to be one set of image processing. Acquiring and storing the position and angle data of pickup target component 480*t*(*n*) may be included in image processing. Also, the number of times image processing is performed is determined by the quantity of component data 570(*n*), which depends on the shape of leaded component 480.

Figure 21:
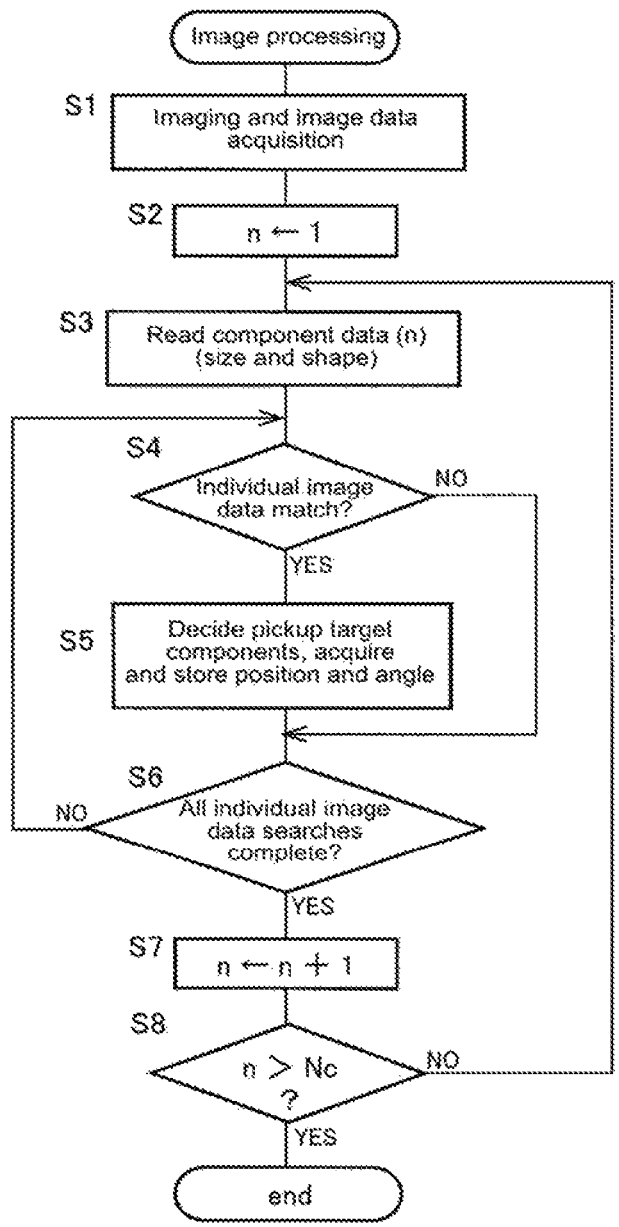
FIG. 21 is a flowchart representing an image processing program stored in the storage section of the above control device.

Image processing is performed by running the image processing program shown in the flowchart in FIG. 21.

In step 1 (hereinafter also referred to as S1, with similar notation used for other steps), imaging device 90 performs imaging of multiple leaded components 480 supported in a loose state on component support surface 198, and image data is acquired. In S2, count value n of the counter that counts the number of times image processing has been performed is given an initial value of one; in S3, component data 570(1) used in the first image processing is read. In S4, each of shape data 572(1) and individual image data 582(*k*) is compared one by one and determination is performed as to whether they match. In a case in which a match is determined, the XY coordinate position and angle θ of that individual image data 582(*k*) are acquired. Then, the leaded component corresponding to that individual image data 582(*k*) is set as pickup target component 480*t*(1) and the position and angle data thereof are stored.

In S6, it is determined whether all individual image data 582(*k*) included in individual image data 580 has been compared to shape data 572(1). If the above determination is no, S4 to S6 are performed again, determination is performed as to whether each individual image data 582(*k*) matches shape data 572(1), and in a case that a match is determined, acquisition and so on of the position and angle of individual image data 582(*k*) is performed.

For example, in FIG. 20, because it is determined that individual image data 582(1) matches shape data 572(1), the XY coordinate position and angle θ1 of individual image data 582(1) are acquired. The leaded component 480 corresponding to individual image data 582(1) is set as pickup target component 480*t*(1), and the position and angle of pickup target component 480*t*(1) are acquired and stored. Because individual image data 582(2) does not match shape data 572(1), the determination in S4 is no, and the position and angle and so on are not acquired. There is no match with individual image data 582(3) either. Then, when determination of a match with shape data 572(1), and acquisition and storing of positions and angles in a case of a match, are completed for all individual image data 582(*k*), the determination in S6 is yes, and first image processing ends.

Next, in S7, one is added to the count value. In S8, it is determined whether count value n is larger than a predetermined quantity Nc (which is a predetermined number of times to perform image processing, corresponding to the quantity of component data 570(*n*); in the present embodiment, Nc=3). In a case in which the count value is Nc or fewer, in S3, count value two, that is, component data 570(2) used for the second image processing is read, and in a similar manner as above, in S4 to S6, determination is performed as to whether each individual image data 582(*k*) (items for which a match with shape data 572(1) was determined may be excluded) matches shape data 572(2), and in a case that a match is determined, the position and angle of pickup target component 480*t* corresponding to matching individual image data 582(*k*) are acquired and stored.

For example, individual image data 582(2) is determined to match shape data 572(2), and the leaded component corresponding to individual image data 582(2) is set as pickup target component 480*t*(2). Further, the position and angle θ2 are acquired, and the position and angle data are stored. It is determined that individual image data 582(3) and 582(4) do not match. When processing is complete for all individual image data 582(*k*), the determination in S6 is yes, and second image processing ends. Next, after S7 and S8, third image processing is performed in the same way, with component data 570(3) used in third image processing being read, determination performed as to whether each individual image data 582(*k*) matches shape data 572(3), and in a case that a match is determined, the position and angle are acquired and stored. For example, because it is determined that individual image data 582(5) matches shape data 572(3), the leaded component corresponding to individual image data 582(5) is set as pickup target component 480*t*(3), and the position and angle θ5 of pickup target component 480*t*(3) are acquired and stored. In S7, one is added to the count value n, thus becoming four, which means that the determination in S8 is yes, ending the program and the third image processing. Note that, leaded components 480 corresponding to, from individual image data 582(*k*) included in image data 580, individual image data 582(*k*) that does not match any one of shape data 572(1) to (3) are set as non-pickup target component 480*s*.

Figure 22:
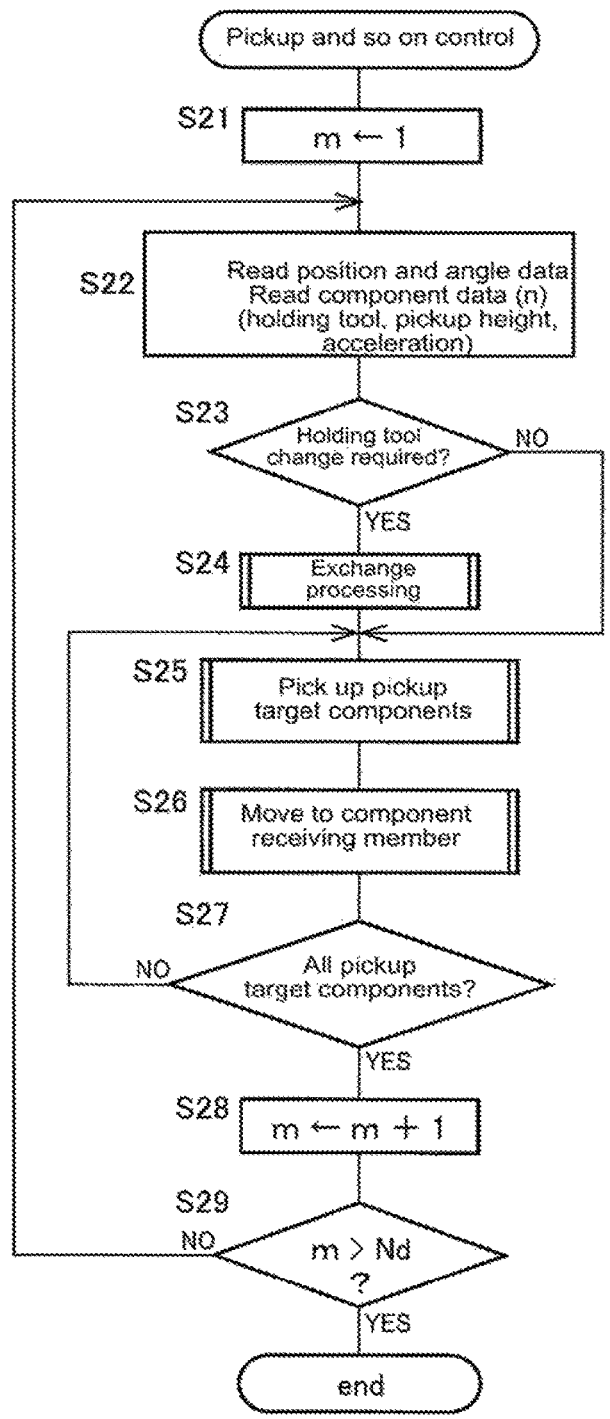
FIG. 22 is a flowchart representing a control program for pickup and so on stored in the storage section of the above control device.

Next, with regard to each of pickup target components 480*t*(1) to (3), exchange of suction nozzle 362, pickup, transport and so on of pickup target component 480*t* is performed under the conditions decided by shape data 570(1) to (3), and component holding head 300, holding head moving device 302, and so on are controlled by running the control program for pickup and so on shown by the flowchart in FIG. 22. In S21, count value m of the counter that counts component data 570(*n*) is given an initial value of one; in S22, nozzle diameter data 574(1), pickup height data 578(1), maximum acceleration data 576(1) of component data 570(1) are read, and the position and angle data of each pickup target component 480*t*(1) stored by the running of S5 of the image processing program are read.

Then, in S23, based on nozzle diameter data 574(1), it is determined whether it is necessary to exchange suction nozzle 362. In a case in which exchange is necessary, the determination is yes, and nozzle exchange is performed in S24. Component holding head 300 is moved to the specified position of nozzle housing device 430, the attached suction nozzle 362 is released, and a suction nozzle determined by nozzle diameter data 574(1) is attached. In nozzle housing device 430, a shutter is moved to the removal allowance position by shutter moving device 434, and in component holding head 300, removing and attaching of suction nozzle 362 is performed by controlling electromagnetic valves 424*c* and *d*. S24 is not performed in a case in which exchange of suction nozzle 362 is not required.

In the present embodiment, because one suction nozzle is held by component holding head 300 as a component holding tool, in a case in which the determination in S23 is yes, the suction nozzle after exchange corresponds to a specified component holding tool, and in a case in which determination in S23 is no, the suction nozzle held at that point corresponds to a specified component holding tool.

In S25, component holding head 300 is moved to the position decided by the position and angle data, and pickup target component 480*t*(1) is picked up at a height decided by pickup height data 578(1). Pickup target component 480*t*(1) is picked up by suction and held by suction nozzle 362 being moved to the pickup height and negative pressure being supplied.

Also, during pickup of the component, suction nozzle 362 is positioned at the non-pivoted position; suction nozzle 362 is pivoted to the 90 degree pivoted position while being moved to the component carrier, such that leads 484 are made to point down. However, because the pivoting direction is fixed as one direction, suction nozzle 362 is rotated on its own axis in a state positioned at the non-pivoted position by an angle determined based on the angle θ, the perpendicular pivoting plane of suction nozzle 362 is made to be parallel to a perpendicular plane parallel to the lengthwise direction of leads 484 of components 480 loaded on component support surface 198, and leads 484 are rotated to be facing downwards by the pivoting. After the attachment of suction nozzle 362 or pickup of pickup target component 480*t*(1), spline shaft 392 is rotated around its own axis, and a rotation point around a vertical line of component main body 482 is aligned with a rotation point of main body reception recess 502.

After pickup and holding of the pickup target component, in S26, suction nozzle 362 (component holding head 300) is transported to component receiving member 460 at the component receiving position. After accelerating, component holding head 30 moves at a constant speed, and then decelerates; because there is a limit on the size of the acceleration or deceleration, transport is performed so that the acceleration (deceleration) does not exceed that represented by maximum acceleration data 576(1). By this, the inertial force acting on leaded component 480 held by suction nozzle 362 is restricted, such that the leaded component 480 does not separate from the suction nozzle easily. At the component receiving position, component holding head 300 is lowered, and leaded component 480 is housed in component reception recess 500 while being guided by guiding surface 506. Then, the supply of negative pressure to suction nozzle 362 is stopped, thus releasing leaded component 480, after which component holding head 300 is raised, and suction nozzle 362 is returned to the non-pivoted position by being pivoted.

In S27, it is determined whether all of the pickup target components 480t(1) corresponding to component data 570(1) are housed in component receiving member 460 of component carriers 450 and 452. If the determination is no, S25 to S27 are repeated. Component holding head 300 is moved to the position of the next pickup target component 480t(1) decided by the position and angle data, and then the pickup target component 480t(1) is picked up and transported to component receiving member 460. In a case where there are multiple pickup target components 480t(1), they are picked up one by one according to a predetermined order.

Then, when all the pickup target components 480t(1) have been moved to component receiving member 460, the determination in S27 is yes, and in S28, one is added to count value m, and in S29 it is judged whether the count value is larger than (Nd=3). If not all the pickup target components 480t(1) have been moved to component receiving member 460, the determination in S27 is no, processing returns to S22, component data 570(2) of count value two is read, and position and angle data of each pickup target component 480t(2) is read.

S23 to S27 are performed in a similar manner. Because nozzle diameter data 574(2) differs from nozzle diameter data 574(1), the determination for S23 is yes, and in S24 exchange of suction nozzle 362 is performed. Further, in S25 and S26, pickup target components 480t(2) are moved to component receiving member 460. S25 to S27 are performed repeatedly, and when all the pickup target components 480t(2) have been moved to component receiving member 460, the determination for S27 is yes, and in S28 one is added to count value m. Similar actions are performed for component data 570(3), and when all the pickup target components 480t(3) have been moved to component receiving member 460, the determination for S27 and S29 is yes, and the program ends. Pickup target components 480t(1) to (3) supported on component support surface 198 are arranged in the same predetermined orientation on component carriers 450 and 452 by being moved to and held in component receiving member 460.

Then, when leaded components 480 are held in every component receiving member 460 of the component carrier positioned at the component receiving position, that component carrier is moved to the component transfer position. Mounting heads 50 and 52 of component mounting device 20 are moved to the component carrier positioned at the component transfer position, and leaded components 480 held by component receiving members 460 are picked up by component holding tools 70. All leaded components 480 have the same orientation, that is, are housed in component receiving members 460 with leads 484 pointing downwards and the upper surface that faces the bottom surface to which leads 484 are attached facing upwards, and component holding tool 70 (for example, a chuck), is able to pick up all lead components 480 favorably.

As described above, in the present embodiment, by processing based on component data 570(n) of image data 300, the orientation of multiple leaded components 480 in a loose state is distinguished and acquired, pickup target components 480t(2) are determined, and the nozzle diameter, pickup height, and transport acceleration maximum value are acquired. As a result, multiple leaded components 480 in a loose data can be picked up favorably, and can be moved to component receiving member 460 favorably.

For example, for suction nozzle 362, an item which a nozzle diameter of a size suitable for the size and shape and so on of the surface facing upwards of pickup target component 480t is used. Supposing that a suction nozzle 362 with a large nozzle diameter is used for all the pickup target components 480t; in this case, for leaded components 480 with an orientation shown in FIGS. 18A and 18B, because the surface that can be picked up on the upwards facing surface is small, these components are set as non-pickup target components. That is, only leaded component 480 with the orientation shown in FIG. 18C is set as a pickup target component. However, if a suction nozzle with a nozzle diameter suitable for the size and shape and so on of the upwards facing surface is selected, leaded components 480 with an orientation shown in FIGS. 18A and 18B are also set as pickup target components. As a result, because it is possible to increase the quantity of leaded components 480 that can be picked up in one supply of loose components, it is possible to reduce the quantity of returned leaded components 480 (the quantity of non-pickup target component 480s).

Also, in a case in which suction nozzle 362 with a small nozzle diameter is used for all pickup target components 480t, although time is not required for exchanging suction nozzle 362, the transport time becomes longer. In particular, in a case in which the pickup height is high, because the orientation of the component during transport and the like is unstable, it is normal to specify a low value for maximum acceleration, which means that transport time becomes longer. In contrast, if a pickup nozzle with a large nozzle diameter is used for pickup target component 480t(1), it is possible to use a large maximum acceleration when transporting pickup target component 480t(1), thus shortening the transport time.

Figure 9:
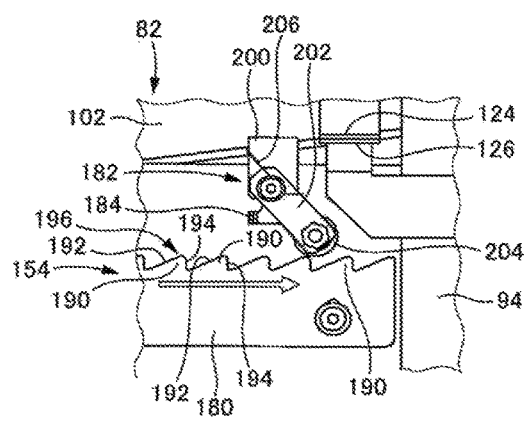
FIG. 9 is a side view illustrating operation of the above supply device oscillating device.

Components designated as non-pickup target components 480s remain on component support surface 198, but these non-pickup target components 480s are returned to component supply device 82 by component returning device 88. As shown in FIG. 8, non-pickup target components 480s are prevented from retreating by lip member 114 and are moved forward with respect to component support member 150, and fall down into component collection container 220. During the retraction of component support member 150, a force in the same direction as the retract direction of component support member 150 acts on cam follower 182 from cam member 180, and stopper 234 allows free rotation of cam follower 182 in this direction. By this, as shown in FIGS. 8 and 9, cam follower 182 rotates with respect to component supply device 82 against the biasing force of torsion coil spring 206 and rides over tooth 190, such that component support member 150 is retracted without oscillating component supply device 82. Thus, components do not fall from component housing section 100 onto component supply surface 110 and are not ejected to component support surface 198.

As shown in FIG. 10A, after component support member 150 has moved to the retract position, as shown in FIG. 10B, component collection container 220 is raised with respect to component supply device 82. In accordance with the raising of component collection container 220, shutter 250 is raised by the biasing of compression coil spring 255, and as shown in FIG. 10C, covers component ejection section 112 in the blocking position. Roller 240 is raised along an outer surface of component supply device 82 together with component collection container 220. Component collection container 220 is raised further after the movement of shutter 250 to the blocking position, and at the end stage of raising and lowering movement in which component collection container 220 is raised to near the upper limit position, as shown in FIG. 11, roller 240 contacts engaging surface 242, such that raising is prevented. By this, component collection container 220, while being further raised to the upper limit position, is rotated against the biasing force of the torsion coil spring to the component ejection position, and collected components 480 are ejected into component housing section 100. In a state with component collection container 220 rotated to the component ejection position, the bottom surface of component collection container 220 is vertical, and rear wall 236 faces further towards component housing section 100 the further it goes down, such that leaded components 480 are ejected to component housing section 100 guided by rear wall 236 without any leaded components 480 being left behind.

Figure 23:
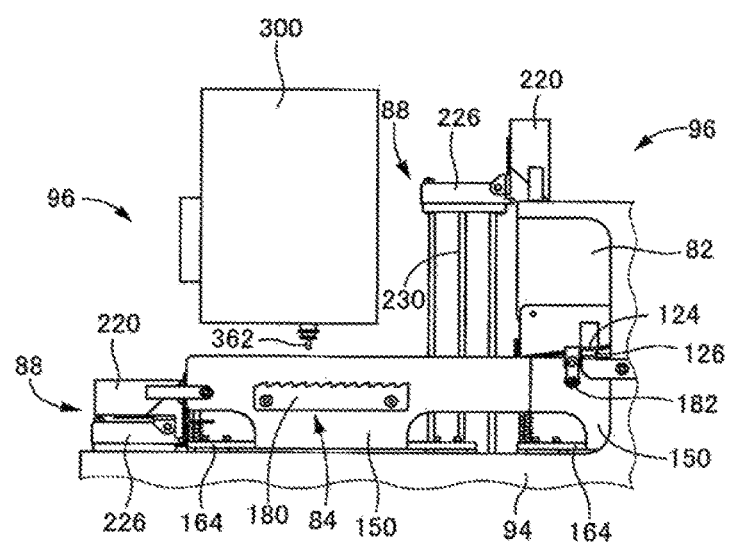
FIG. 23 is a side view showing the relationship between the component returning device of one component supply unit of a set of five when returning components and the component holding head of a component transfer device of another component supply unit.

During the returning of components to component supply device 82 by any one of the five component supply units 96, imaging device 90 and component holding head 300 are able to perform imaging, pickup, and so on of components 480 at a different component supply unit 96. As shown in FIG. 23, component returning is performed with component support member 150 in a state returned to the retract position; component support surface 198 is provided on the front side of component support member 150, so imaging and holding of components 480 on component support surface 198 is able to be performed without interference with component collection container 220.

Also, by removing the portion of loose component supply device 18 excluding shuttle devices 304 and 306 from device main body 10, it is possible to easily perform maintenance on loose component supply device 18.

Note that, before picking up pickup target component 480t, the position of pickup target component 480t can be checked based on image data obtained by imaging component support surface 198 of imaging device 90. By this, it is possible to pick up pickup target component 480t more reliably.

Imaging by imaging device 90 is performed before each pickup of leaded component 480 by component holding head 300, and after suction nozzle 362 (component holding head 300) has held leaded component 480 of component support surface 198, transport to component receiving member 460 is performed in parallel. Because component holding head 300 is moved to a height region between imaging device 90 and component support surface 198, there is no interference with imaging device 90 and component holding head 300. Therefore, imaging device 90 remains at a position above component support surface 198, and imaging is performed after component holding head 300 that is holding leaded component 480 has retracted. By this, for example, even if the position or orientation of pickup target component 480t scheduled to be picked up next on one of the component supply units 96 is changed due to pickup operation or the like of the previous leaded component 480, that change can be obtained.

Also, component holding head 300 is not limited to the above embodiment. For example, various types of heads may be used, such as a head that is able to hold multiple suction nozzles with different nozzle diameters in a ring shape, or a head able to hold multiple of the above suction nozzles in a straight line separated by regular intervals. Further, component holding head 300 may be changed between each of the above heads either automatically or manually. Further, component holding head 300, in a case of a head able to hold multiple suction nozzles, a suction nozzle decided according to nozzle diameter data 574 is positioned at a predetermined pickup position, and accordingly, the suction nozzle that picks up the pickup target component is changed. In the present embodiment, a suction nozzle at a fixed position corresponds to a specified component holding tool.

Further, it is possible for a component supported by component support surface 198 to be picked up by suction nozzle 362 and to be supplied to board 12 directly. In this case, the movement range of component holding head 300 by component holding head moving device 302 is a range including held board 12.

In the present embodiment, (1) a loose component support section is configured from component support surface 198 and so on. (2) A component transfer section is configured from component carriers 450 and 452. (3) It can be considered to configure a holding tool changing device from nozzle attachment device 368 or the like, and it can be considered to configure the holding tool changing device from, for example, among nozzle attachment device 368 and control device 26, a portion that runs or a portion that memorizes S24 of the control program for pickup and the like shown in the flowchart of FIG. 22. The holding tool changing device is also the holding tool exchanging device. (4) A change-use moving section is configured from a section or the like from among holding head moving device 302 that moves component holding head 300 between component support surface 198 and nozzle housing device 430. (5) A pickup-use moving section is configured from a section or the like from among holding head moving device 302 that raises suction nozzle 362 to the pickup height. (6) An acceleration limiting moving device is configured from a section or the like that moves component holding head 300 without exceeding the acceleration decided by the maximum acceleration data of holding head moving device 302. (7) A component data storage section is configured from storage section 550m or the like of control device 26. A component data storage section may be provided in overall control device 26a. (8) A loose component supply device control device is configured from, among control device 26, a portion that stores a pickup and the like control program, a portion that runs the control program, a component data storage portion, and the like. Also, a pickup height acquisition section is configured from, among loose component supply device control device, a component data storage section, a portion that stores S22, a portion that runs S22, and the like; a pickup height control section is configured from a portion that stores S25, a portion that runs S25, and the like. (9) A next process may be a "step for mounting components on board 12" performed at component mounting device 20, a "step for processing" performed with respect to component mounted on board 12, or with respect to board 12 on which components are mounted (for example, a cut and clinch step in which leads are cut and bent, a solder application step in which solder is applied to leaded components, a step for performing heat processing or the like on board 12, a step of unloading from the component mounting device, and the like).

Embodiment 2

Figure 24:
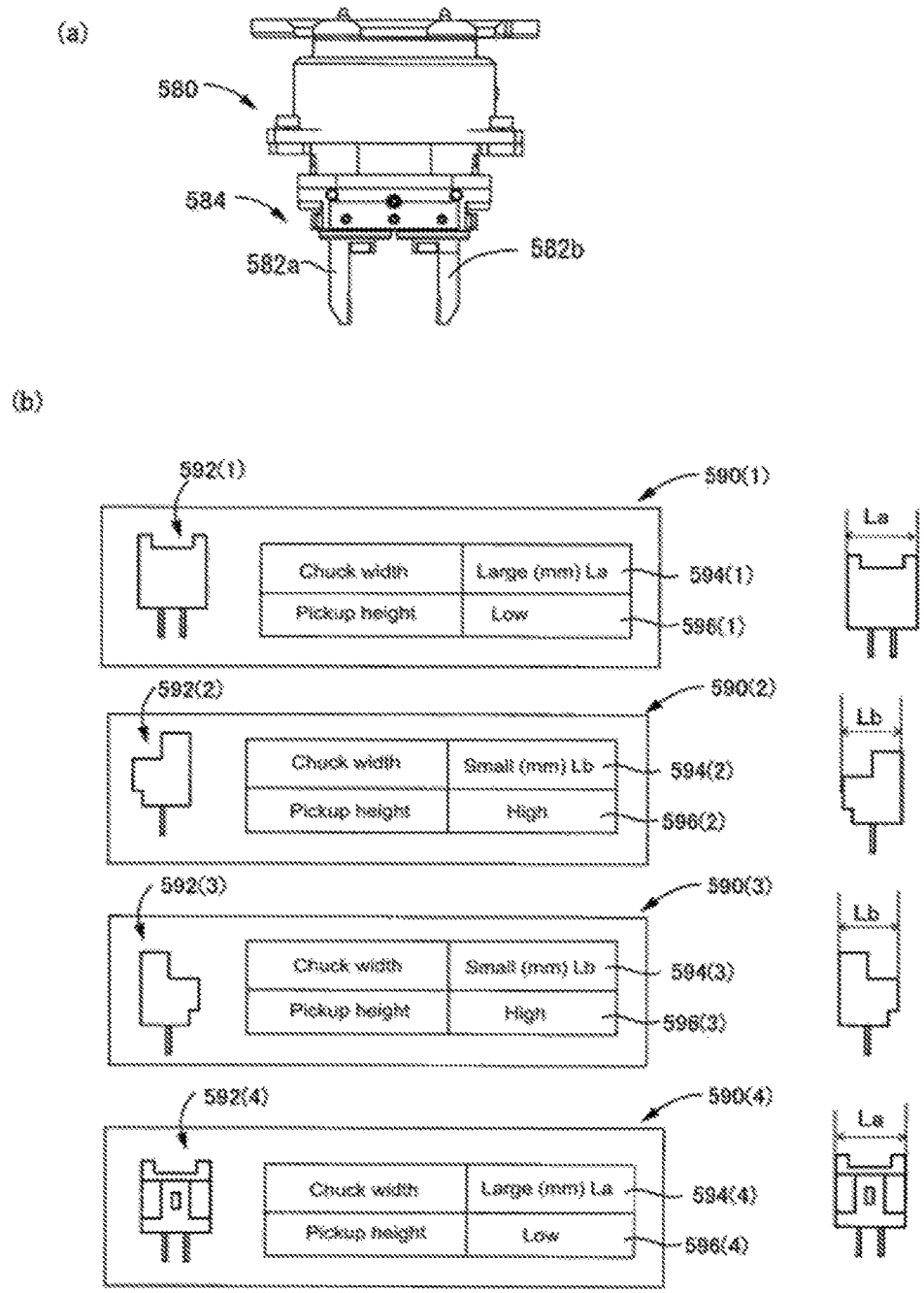
FIG. 24A is a front view showing a chuck that can be attached to and removed from a holding tool attachment section of the component holding head of a loose component supply device of a second embodiment of the present disclosure.
FIG. 24B is a conceptual diagram showing component data stored in a storage section of a control device of a component mounter of a second embodiment of the present disclosure.

Chuck 580 shown in FIG. 24 may be attached to the holding tool holding member of the component holding head. Chuck 580 includes a pair of claws 582p and q held on a chuck main body, slide-type driving device 584 that moves the pair of claws 582p and q towards and away from each other, and the like. The width of pickup target components that can be grasped by chuck 580 is decided in advance.

In the present embodiment, because the component holding tool is chuck 580, as shown in FIG. 18D, leaded component 480 for which difficult-to-pick-up side surface 486d is facing upwards is also set as pickup target component 480t(4). Even if the upward facing surface is a surface with a shape that is difficult to pick up, side surfaces 486b and c that are opposite each other can be grasped by the pair of claws 582p and q. For example, leaded component 480 corresponding to individual image data 582(4) included in image data 580 shown in FIG. 20, is set as pickup target component 480t.

An example of component data 590(n) of leaded component 480 in the present disclosure is conceptually shown in FIG. 24B. Component data 590(n) (n=1, 2, 3, 4) each includes data representing [1] shape data 592, and [2] parameters concerned with pickup and the like of pickup target components 480t. At least one of (i) chuck width data 594(n) that represents the chuck width of the chuck for grasping the pickup target component (the width of a component that can be grasped by the pair of claws 582p and q), and (ii) pickup height data 596(n) and the like. A chuck with a large chuck width is selected for pickup target components 480t(1) and (4); a chuck with a small chuck width is selected for pickup target components 480t(2) and (3). However, in a case in which the holding power for leaded component 480 by chuck 580 is substantially the same despite a difference in width of pickup target components 480t, it is possible to have a maximum acceleration of the same size even if the orientation of pickup target component 480t changes. In this case, data representing parameters related to pickup and so on of pickup target component 480t do not necessarily have to contain maximum acceleration data.

In the present embodiment, image processing is performed four times by comparing image data 580 and each of shape data 592(1) to (4), to decide pickup target components 480(1) to (4). Also, each of these pickup target components 480t(1) to (4) is picked up by chuck 580, and arranged on component carriers 450 and 452 by being moved to component receiving member 460.

Embodiment 3

Figure 25:
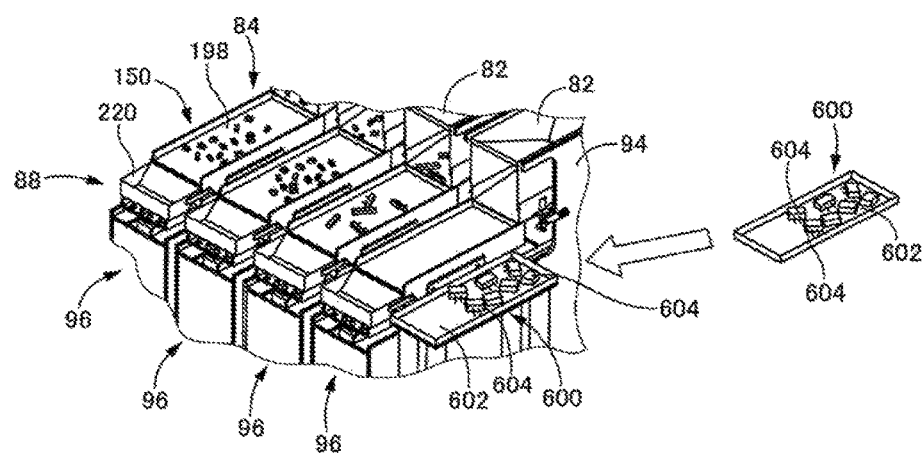
FIG. 25 is a perspective view showing a portion of a loose component supply device of a third embodiment of the present disclosure.

As shown in FIG. 25, it is possible to provide manual loading component tray 600 that forms a manual loading component support member in a detachable manner instead of component supply unit 96. Manual loading component tray 600 is provided with flat component support surface 602 and multiple components 604 are supported on component support surface 602 in a loose state.

Components 604 are loaded on manual loading component tray 600 by an operator after attaching manual loading component tray 600 to main body 80, or before attaching manual loading component tray 600 to main body 80 and outside of loose component supply device. Supply of components using such a manual loading component tray is appropriate when supplying components with leads that bend easily, components that should not contact each other, components for which oscillation is not desirable, large components, and so on.

Note that, the size of manual loading component tray is not restricted. For example, the size may be with a width substantially the same as the width as component supply unit 96, or may be larger than the width of component supply unit 96.

Other Embodiments

Note that, the present disclosure is not limited to the above example embodiments, and various changed or improved methods of embodiment are possible based on the knowledge of someone skilled in the art. Also, the above multiple embodiments may be applied in combination with one another. For example, in a case in which component support member 150 or manual loading component tray 600 is arranged inside the movement range of mounting head 50 and 52 by work head moving device 54, components 480 and 604 in a loose state may be picked up directly by mounting heads 50 and 52 and then mounted directly on board 12. In this case, multiple components 480 and 604 supported in a loose state on component support member 150 or manual loading component tray 600 may be imaged by imaging device 22 provided on mounting head 50.

Also, component holding tool 70 may be held on mounting heads 50 and 52 so as to be pivotable around a horizontal axis line, such that components 480 and 604 supported in a loose state on component support member 150 or manual loading component tray 600 are pivotable around a horizontal axis line by component holding tool 70. In a similar manner as to the first embodiment, the orientation of loose components 480 and 604 is acquired based on image data, and exchange of component holding tool 70 is performed accordingly, with pickup being performed at the height decided by the orientation of the pickup target component, and transport being performed without exceeding the maximum acceleration decided by the orientation.

Alternatively, components 480 and 604 supported in a loose state on component support member 150 or manual loading component tray 600 may be held by component holding tool 70 (non-pivotable component holding tool) of mounting heads 50 and 52. In the present embodiment, based on image data, components are held by mounting heads 50 and 52, components with an orientation that allows pickup are set as pickup target components, and the pickup height and the like are acquired. Mounting heads 50 and 52 are moved to the position of a pickup target component, and the pickup target component is picked up at the acquired height. The present embodiment is appropriate for mounting of components without leads. Note that, at least one of mounting 50 and 52 may be a head capable of holding multiple component holding tools provided in a circle or lined up in a straight line. In the present embodiment, manual loading component tray 600 and the like corresponds to a mounting-use loose component support section, imaging device 22 corresponds to a mounting-use imaging device, component holding tool 70 corresponds to a mounting-use component holding tool, mounting heads 50 and 52 correspond to a mounting-use component holding head, and work head moving device 54 corresponds to a mounting-use holding head moving device. Also, mounting-use holding head movement control device is configured from a portion that controls work head moving device 54 of control device 26 (including the individual control device of mounting device 20) and the like. A pickup height acquisition section is configured from, among the mounting-use holding head movement control device, for example, a section that acquires the pickup height based on image data; a pickup height movement control section is configured from, for example, a section that controls work head moving device 54 based on the pickup height.

REFERENCE SIGNS LIST

18: loose component supply device; 20: component mounting device; 26: control device; 82: component supply device; 84: component scattering device; 86: component transfer device; 88: component returning device; 90: imaging device; 198: component support surface; 220: component collection container; 364: nozzle rotating device; 366: nozzle pivoting device; 368: nozzle attachment device; 450, 452: component carrier; 550: individual control device; 550*m*: storage section; 552: image processing device; 570, 590: component data

The invention claimed is:
1. A loose component supply device comprising:
a loose component support section that supports multiple of the same type of components in a loose state;
an imaging device that images the multiple components in the loose state supported on the loose component support section, the imaging device being mounted on either a main body of the loose component supply device or an imaging device moving device, above the loose component support section;
a plurality of component holding tools capable of picking up and holding the multiple components in the loose state supported on the loose component support section;
a component holding head which holds one of the plurality of component holding tools;
a holding head moving device that moves the component holding head at least and from the loose component support section and a component transfer section at which transfer to a next process is possible; and
a holding tool changing device that changes the one of the plurality of component holding tools held by the component holding head to another of the plurality of component holding tools based on image data obtained by the imaging of the imaging device,
the loose component supply device picking up each of the multiple components in the loose state supported on the loose component support section and arranging the multiple components in a predetermined orientation on the component transfer section.

2. The loose component supply device according to claim 1, wherein
the loose component supply device includes a holding tool housing device that houses the plurality of component holding tools that are different from each other,
the holding head moving device includes a change-use moving section capable of moving the component holding head to and from the loose component support section and the holding tool housing device, and the holding tool changing device includes a holding tool exchanging section that exchanges the one of the plurality of component holding tools to the another of the plurality of component holding tools based on the image data.

3. The loose component supply device according to claim 1, wherein
the holding tool changing device includes a holding tool positioning section that positions a specified component holding tool that is, from among the plurality of component holding tools, the component holding tool that picks up a pickup target component that is at least one of the multiple components, based on the image data.

4. The component supply device according to claim 1, wherein
the holding head moving device includes a pickup-use moving section capable of moving, from among the plurality of component holding tools, a specified component holding tool that is the component holding tool that picks up the pickup target component that is at least one of the multiple components, to a height decided based on the image data, and
the specified component holding tool picks up each of the pickup target components at the height to which the specified component holding tool was moved by the pickup-use moving section.

5. The component supply device according to claim 1, wherein
the holding head moving device includes an acceleration limiting moving device that moves the component holding head at an acceleration that does not exceed an acceleration decided based on the image data when the one of the plurality of component holding tools is holding the component.

6. A component mounting device that includes the loose component supply device according to claim 1 and that mounts components supplied by the loose component supply device on a circuit board, wherein each of the multiple components includes multiple surfaces that have a different size or shape to each other,
the image data includes multiple individual image data representing the size and shape of a top view of each of the multiple components,
the component mounting device includes a loose component supply device control device provided with an image data processing device that processes the image data and acquires at least the orientation of each of the multiple components, the loose component supply device control device controlling the loose component supply device based on the orientation of each of the multiple components acquired by the image data processing device, and wherein
the loose component supply device control device includes a component data storage section that stores
(1) each of multiple shape data representing the size and shape of the multiple surfaces, and
(2) component data decided to correspond to each of the multiple shape data that includes at least one of (a) holding tool type regulating data that regulates the type of component holding tool, (b) pickup height data that represents the pickup height of the component by the component holding tool, and (c) maximum acceleration data that regulates the maximum acceleration when moving the component holding tool.

7. The component supply device according to claim 1, wherein
the imaging device includes a camera.

8. The component supply device according to claim 1, wherein each of the plurality of component holding tools is a suction nozzle, each suction nozzle having a different nozzle diameter.

* * * * *